US012268002B2

(12) United States Patent
Oike et al.

(10) Patent No.: US 12,268,002 B2
(45) Date of Patent: Apr. 1, 2025

(54) SEMICONDUCTOR MEMORY DEVICE

(71) Applicant: Kioxia Corporation, Tokyo (JP)

(72) Inventors: Go Oike, Mie (JP); Hanae Ishihara, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 129 days.

(21) Appl. No.: 18/065,298

(22) Filed: Dec. 13, 2022

(65) Prior Publication Data

US 2023/0113904 A1 Apr. 13, 2023

Related U.S. Application Data

(63) Continuation of application No. 17/119,095, filed on Dec. 11, 2020, now Pat. No. 11,557,605, which is a (Continued)

(30) Foreign Application Priority Data

Jan. 9, 2018 (JP) ................................ 2018-001537

(51) Int. Cl.
*H10B 43/27* (2023.01)
*H10B 43/10* (2023.01)
(Continued)

(52) U.S. Cl.
CPC ............ *H10B 43/27* (2023.02); *H10B 43/10* (2023.02); *H10B 43/35* (2023.02); *H10B 43/40* (2023.02); *H10B 43/50* (2023.02)

(58) Field of Classification Search
CPC ........ H10B 43/27; H10B 43/10; H10B 43/35; H10B 43/40; H10B 43/50; H10B 41/20; H10B 43/20
See application file for complete search history.

(56) References Cited

U.S. PATENT DOCUMENTS 8,089,120 B2 1/2012 Tanaka et al.
9,076,502 B2 7/2015 Nakajima
(Continued)

FOREIGN PATENT DOCUMENTS

JP 2007-266143 10/2007
JP 5364336 12/2013
(Continued)

*Primary Examiner* — Thanhha S Pham
(74) *Attorney, Agent, or Firm* — Oblon, McClelland, Maier & Neustadt, L.L.P.

(57) ABSTRACT

According to an embodiment, a semiconductor memory device includes a substrate, a stacked body, a plurality of first members, and at least one first insulating member. The stacked body is provided on the substrate and includes a plurality of electrode layers. The electrode layers are stacked apart from each other in a first direction and extend in a second direction parallel to an upper surface of the substrate. The first members are provided in the stacked body and extend in the first direction and the second direction. The first insulating member is provided in the stacked body and extends in the first direction and a third direction so that the electrode layers are divided into a plurality of regions in the second direction, the third direction intersecting with the second direction and being parallel to the upper surface of the substrate.

12 Claims, 23 Drawing Sheets

Related U.S. Application Data continuation of application No. 16/127,512, filed on Sep. 11, 2018, now Pat. No. 10,896,915.

(51) Int. Cl.

| | |
|---|---|
| ***H10B 43/35*** | (2023.01) |
| ***H10B 43/40*** | (2023.01) |
| ***H10B 43/50*** | (2023.01) |

(56) References Cited

U.S. PATENT DOCUMENTS

| | | | | |
|---|---|---|---|---|
| 2007/0252201 | A1 | 11/2007 | Kito et al. | |
| 2013/0126957 | A1 | 5/2013 | Higashitani et al. | |
| 2016/0020169 | A1 | 1/2016 | Matsuda | |
| 2016/0365352 | A1 | 12/2016 | Nishikawa | |
| 2017/0053935 | A1 | 2/2017 | Fukuzumi et al. | |
| 2017/0069731 | A1 | 3/2017 | Kim et al. | |
| 2017/0263625 | A1 | 9/2017 | Kikutani | |
| 2017/0263634 | A1 | 9/2017 | Inokuma et al. | |
| 2017/0323898 | A1 | 11/2017 | Oh et al. | |
| 2018/0277499 | A1* | 9/2018 | Oshiki .................. | H10B 43/10 |

FOREIGN PATENT DOCUMENTS

| | | |
|---|---|---|
| JP | 2015-28989 | 2/2015 |
| TW | 201526165 A | 7/2015 |

* cited by examiner

SEMICONDUCTOR MEMORY DEVICE

CROSS-REFERENCE TO RELATED APPLICATIONS

This application is a continuation of and claims benefit under 35 U.S.C. § 120 to U.S. application Ser. No. 17/119,095, filed Dec. 11, 2020, which is based upon and claims benefit under 35 U.S.C. § 120 to U.S. application Ser. No. 16/127,512, filed Sep. 11, 2018 (now U.S. Pat. No. 10,896,915), which is based upon and claims the benefit of priority under 35 U.S.C. § 119 to Japanese Patent Application No. 2018-001537, filed on Jan. 9, 2018; the entire contents of each of which are incorporated herein by reference.

FIELD

Embodiments of the invention relate generally to a semiconductor memory device.

BACKGROUND

A semiconductor memory device of a three-dimensional structure has a structure in which a memory cell array including a plurality of memory cells and a drive circuit are integrated. In the memory cell array, a stacked body in which insulating layers and electrode layers are alternately stacked on a substrate is provided, and a memory hole is formed in the stacked body. An end portion of the stacked body is processed in a step shape, and each electrode layer is led to the outside of the stacked body via a contact. Further, the drive circuit is located between the substrate and the stacked body and is electrically connected to an external circuit or the like through a contact in the stacked body. In the semiconductor memory device, since a structure in which the electrode layer is long in one direction is provided, there is a problem in that a resistance value of the electrode layer increases as the number of layers in the stacked body increases or as a pitch in the electrode layer decreases.

DETAILED DESCRIPTION

Figure 1:
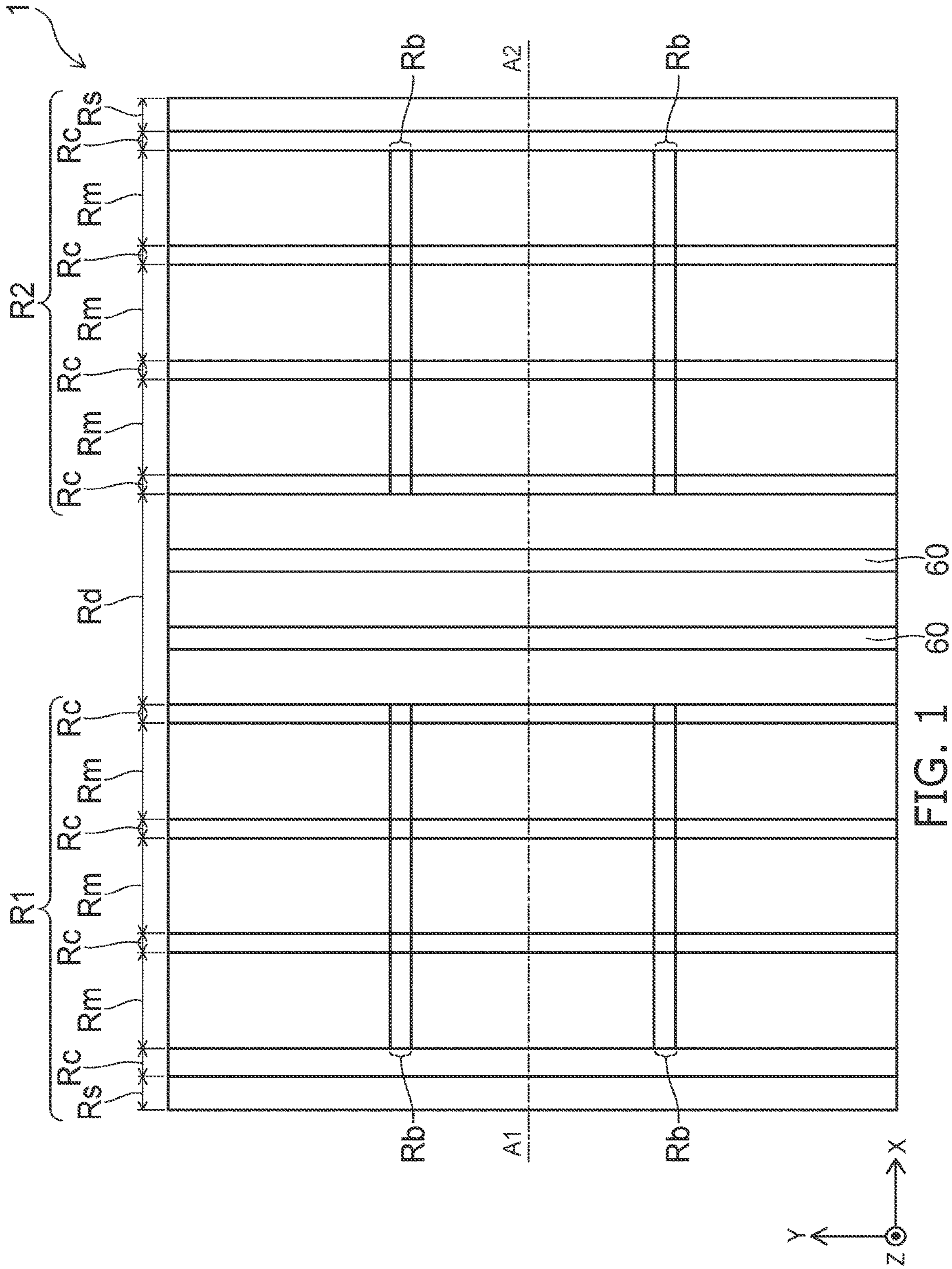
FIG. 1 is a plane view showing a semiconductor memory device according to a first embodiment.

According to an embodiment, a semiconductor memory device includes a substrate, a stacked body, a plurality of first members, and at least one first insulating member. The stacked body is provided on the substrate and includes a plurality of electrode layers. The electrode layers are stacked apart from each other in a first direction and extend in a second direction parallel to an upper surface of the substrate. The first members are provided in the stacked body and extend in the first direction and the second direction. The first insulating member is provided in the stacked body and extends in the first direction and a third direction so that the electrode layers are divided into a plurality of regions in the second direction, the third direction intersecting with the second direction and being parallel to the upper surface of the substrate.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the specification, "intersect" means that two components intersect at an intersection point and includes a shape that one component does not pierce to another component, for example, a letter T shape that two components intersect, when viewed in one direction. In the specification, "provided on" includes the case of being provided to contact directly and further includes the case of being provided with another component inserted therebetween.

First Embodiment

FIG. 1 is a plane view showing a semiconductor memory device 1.

Figure 2:
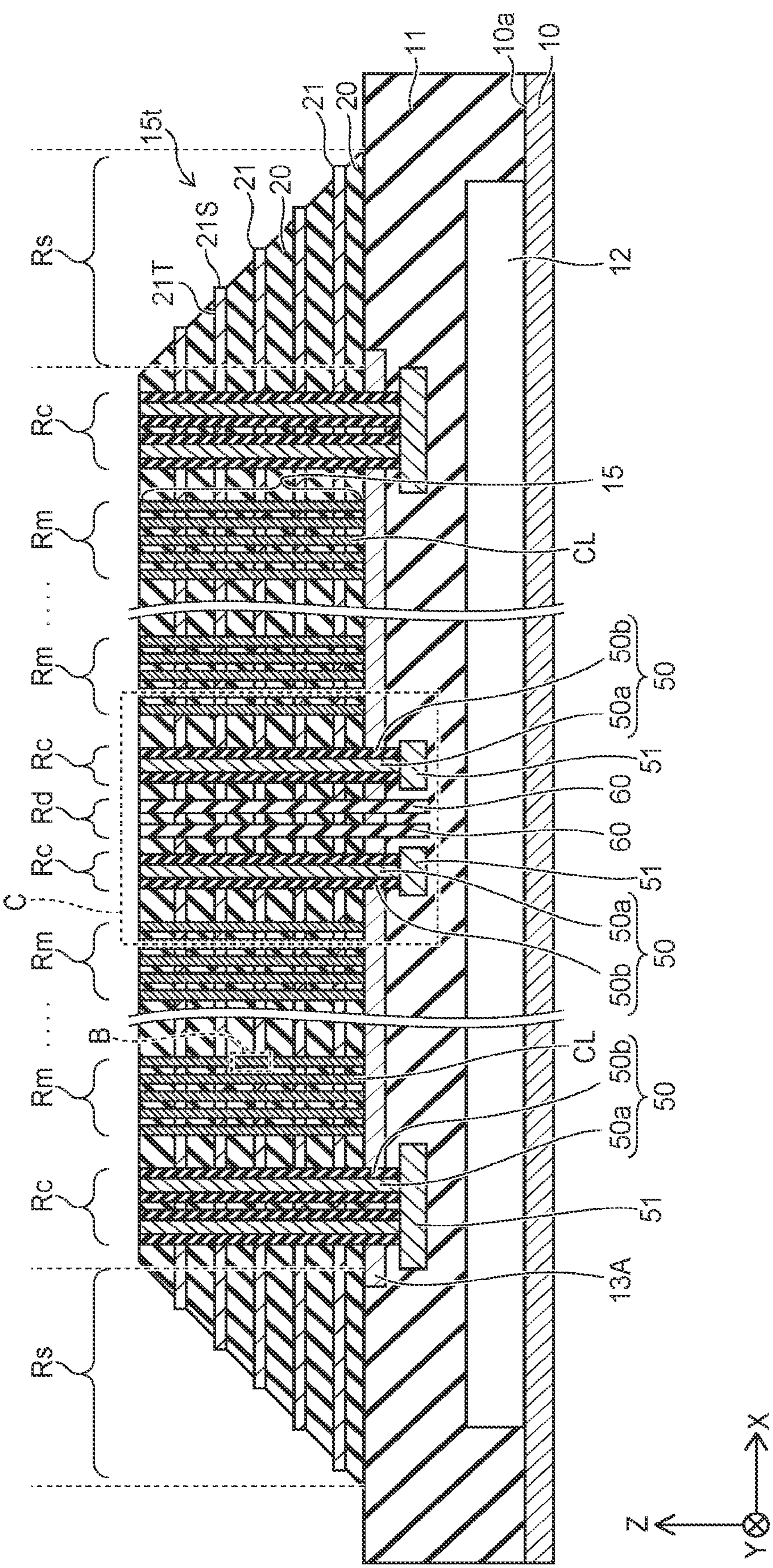
FIG. 2 is a cross-sectional view taken along line A1-A2 of FIG. 1.

FIG. 2 is a cross-sectional view taken along line A1-A2 of FIG. 1.

Figure 3:
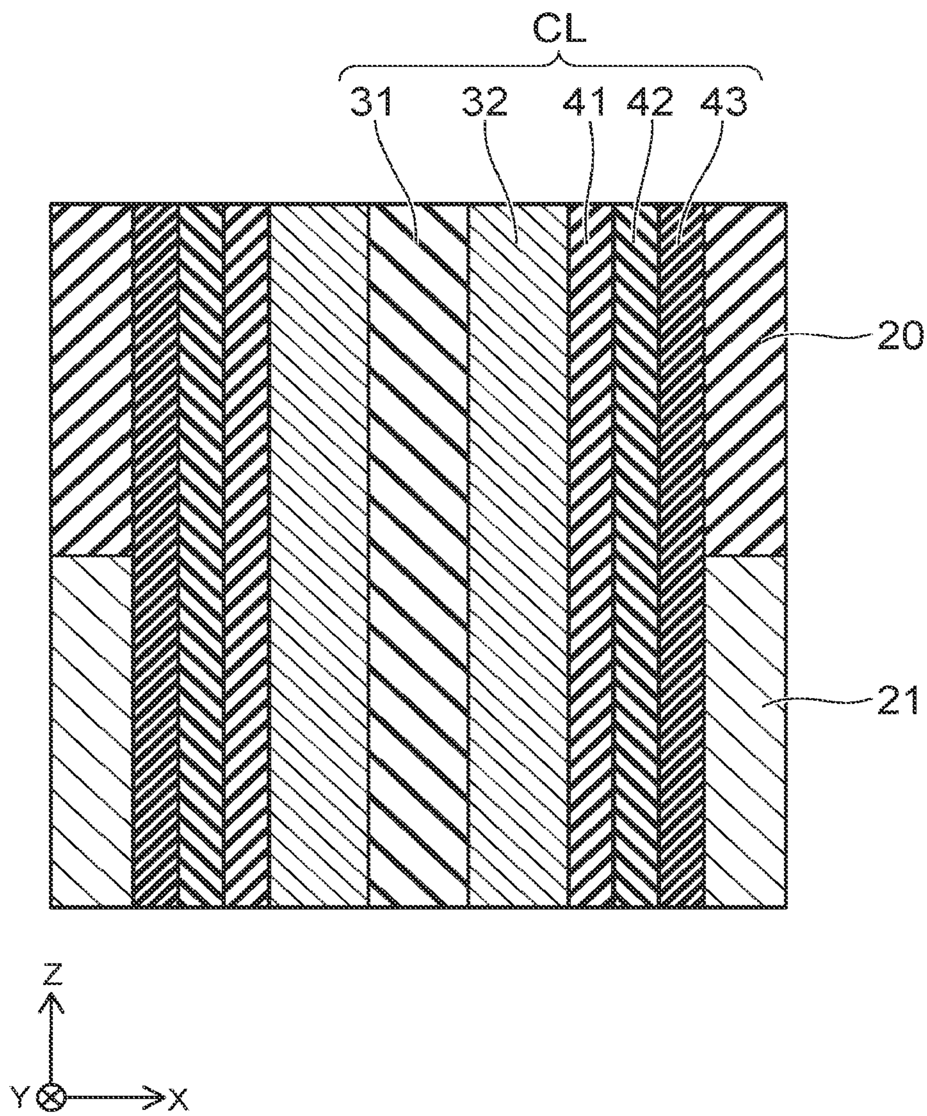
FIG. 3 is an enlarged sectional view showing a region B of FIG. 2.

FIG. 3 is an enlarged sectional view showing a region B of FIG. 2.

As shown in FIG. 1 and FIG. 2, a substrate 10 containing silicon (Si) or the like is provided in the semiconductor memory device 1. In the following specification, for the sake of convenience of description, an XYZ orthogonal coordinate system is employed. Two directions which are parallel to an upper surface 10*a* of the substrate 10 and orthogonal to each other are referred to as an "X-direction" and a "Y-direction," respectively, and a direction vertical to the upper surface 10*a* is referred to as a "Z-direction."

As shown in FIG. 1, a cell region Rm, a first contact region Rc, a second contact region Rb, a step region Rs, and a dividing region Rd are provided in the semiconductor memory device 1.

A memory cell array including a plurality of memory cells is provided in the cell region Rm. A plurality of cell regions Rm are provided, for example, six cell regions Rm are disposed along the X-direction.

For example, a contact extending in the Z-direction is provided in the first contact region Rc. The contact is, for example, a piercing via (see FIG. 2). A plurality of first contact regions Rc are provided, and, for example, eight first contact regions Rc are disposed along the X-direction. For example, one or more piercing vias are provided in the first contact region Rc. Incidentally, the number of piercing vias provided in each of the first contact regions Rc is arbitrary. Further, the number of first contact regions Rc is arbitrary.

For example, a contact for supplying electric power to a plurality of bit lines (not shown) is provided in the second contact region Rb. The plurality of bit lines extend in the Y-direction and are electrically connected to the plurality of memory cells located in the cell region Rm. A plurality of second contact regions Rb are provided, for example, four second contact regions Rb are disposed to extend in the X-direction. For example, one or more contacts are provided in the second contact region Rb. Incidentally, the number of contacts provided in each of the second contact regions Rb is arbitrary. Further, the number of second contact regions Rb is arbitrary.

For example, a plurality of contacts extending in the Z-direction are provided in the step region Rs. The plurality of contacts electrically connect a peripheral circuit located around the periphery of the step region Rs with a plurality of electrode layers (see FIG. 2) having a step shape.

In the example shown in FIG. 1, a region R1 is configured with the cell regions Rm and the first contact regions Rc alternately disposed along the X-direction and the step region Rs located at one end in the X-direction. Further, a region R2 is configured with the cell regions Rm and the first contact regions Rc alternately disposed along the X-direction and the step region Rs located at the other end in the X-direction.

A plurality of insulating members 60 extending in the Y-direction and the Z-direction are provided in the dividing region Rd. The dividing region Rd is provided around the vicinity of the center in the semiconductor memory device 1 between the region R1 and the region R2. The region R1 and the region R2 are divided by the dividing region Rd.

As shown in FIG. 2, an interlayer insulating layer 11, a circuit portion 12, an interconnect layer 13A, a stacked body 15, a columnar portion CL, a piercing via 50, an interconnect 51, and the insulating member 60 are provided in the semiconductor memory device 1.

The interlayer insulating layer 11 is provided on the substrate 10. The interlayer insulating layer 11 includes, for example, a silicon oxide.

The circuit portion 12 is provided on the substrate 10 to be covered with the interlayer insulating layer 11. The circuit portion 12 is a circuit disposed below the memory cell, and includes for example, a part of a drive circuit which performs writing, reading, and erasing of data on the memory cell or a sense amplifier. For example, the circuit portion 12 has a plurality of transistors disposed along the X-direction and the Y-direction. The transistor is, for example, a metal-oxide-semiconductor field-effect transistor (MOSFET). In this case, an upper portion of the substrate 10 may be partitioned into a plurality of active areas by a shallow trench isolation (STI), and a transistor may be provided in the active area.

The interconnect layer 13A is provided in the interlayer insulating layer 11. The interconnect layer 13A includes, for example, polysilicon to which impurities are added. The interconnect layer 13A functions as, for example, a source line. Incidentally, in FIG. 2, the interconnect layer 13A is not divided by the first contact region Rc, but the interconnect layer 13A may be divided. For example, in a case in which the interconnect layer 13A is divided by the first contact region Rc, the interconnect layers 13A may be electrically connected with each other via an interconnect layer different from a contact.

The stacked body 15 is provided on the interlayer insulating layer 11. A plurality of insulating layers 20 and a plurality of electrode layers 21 are provided in the stacked body 15, and the insulating layers 20 and the electrode layers 21 are alternately stacked on each layer in the Z-direction. The number of stacked layers of the insulating layers 20 and the electrode layers 21 is arbitrary. The insulating layer 20 includes, for example, a silicon oxide. The electrode layer 21 includes metal such as tungsten.

The electrode layer 21 located in the bottom layer among the plurality of electrode layers 21 is, for example, a source side selecting gate and is provided above the interlayer insulating layer 11 with the insulating layer 20 interposed therebetween. The electrode layer 21 located in the top layer among the plurality of electrode layers 21 is, for example, a drain side selecting gate. The electrode layer 21 provided between the electrode layer 21 (source side selecting gate) of the bottom layer and the electrode layer 21 (drain side selecting gate) of the top layer among the plurality of electrode layers 21 is, for example, a word line.

An end portion 15*t* of the stacked body 15 is located in the step region Rs. A shape of the end portion 15*t* of the stacked body 15 is a step shape in which a step 21S and a terrace 21T are formed in the electrode layer 21. Here, a structure of the step shape refers to a structure in which steps and terraces are alternately disposed. For example, in the end portion 15*t* of the stacked body 15, a contact (not shown) extending in the Z-direction is provided on the terrace 21T of the electrode layer 21. For example, the electrode layer 21 is electrically connected to a peripheral circuit located around the periphery of the step region Rs via the contact. The electrode layer 21 may be electrically connected to the circuit portion 12.

Incidentally, in the example shown in FIG. 2, the interlayer insulating layer 11, the circuit portion 12, the interconnect layer 13A, and the stacked body 15 are located in the region R1 and the region R2.

The columnar portion CL is provided in the stacked body 15. The columnar portion CL is located in the cell region Rm. The columnar portion CL is located in a memory hole extending in the Z-direction. The columnar portion CL may be formed by alternately forming a plurality of stacked bodies 15 and a plurality of memory holes. In this case, the columnar portion CL includes a first portion formed in a lower layer stacked body 15 and a second portion formed in an upper layer stacked body 15. Further, in a case in which a plurality of columnar portions CL are provided, for example, the plurality of columnar portions CL are disposed in a lattice pattern in the X-direction and the Y-direction.

As shown in FIG. 3, the columnar portion CL includes a core insulating film 31, a channel 32, a tunnel insulating film 41, a charge storage film 42, and a block insulating film 43.

The core insulating film 31 includes, for example, a silicon oxide. For example, the core insulating film 31 extends in the Z-direction in a columnar shape. The core insulating film 31 may not be included in the columnar portion CL.

The channel 32 is provided around the periphery of the core insulating film 31. The channel 32 is a semiconductor portion, and includes, for example, a polysilicon obtained by crystallizing amorphous silicon. The channel 32 extends in the Z-direction in a cylindrical shape and has a lower end which comes into contact with the interconnect layer 13A.

The tunnel insulating film 41 is provided around the periphery of the channel 32. The tunnel insulating film 41 includes, for example, a silicon oxide.

The charge storage film 42 is provided around the periphery of the tunnel insulating film 41. The charge storage film 42 is a film for accumulating charges and includes, for example, a silicon nitride (SiN).

The block insulating film 43 is provided around the periphery of the charge storage film 42. The block insulating film 43 includes, for example, a silicon oxide.

The upper end of the columnar portion CL is connected to a bit line (not shown) via a contact or the like.

The piercing via 50 is provided in the interlayer insulating layer 11 and the stacked body 15. The piercing via 50 is located in the first contact region Rc. The piercing via 50 is located in a hole extending in the Z-direction. The piercing via 50 is configured with a conductive portion 50*a* and an insulating portion 50*b* provided around the periphery of the conductive portion 50*a* and extends in the Z-direction to pierce the interconnect layer 13A. For example, the conductive portion 50*a* includes metal such as tungsten, and the insulating portion 50*b* includes a silicon oxide.

The interconnect 51 is provided in the interlayer insulating layer 11. The interconnect 51 is located in the first contact region Rc. The interconnect 51 is formed of, for example, a metallic material.

An upper end of the piercing via 50 (the conductive portion 50*a*) is connected to, for example, an interconnect for supplying electric power from a power source unit (not shown), an interconnect for transmitting a signal from an external circuit (not shown), or the like in the semiconductor memory device 1. A lower end of the piercing via 50 (the conductive portion 50*a*) is connected to the interconnect 51. A lower layer interconnect (not shown) is provided in the interlayer insulating layer between the interconnect 51 and the circuit portion 12, and the piercing via 50 is electrically connected to the circuit portion 12 via the interconnect 51 and the lower layer interconnect.

In the first contact region Rc, the piercing via 50 is connected to the interconnect 51, but a part of the piercing via 50 may be connected to the interconnect layer 13A.

The plurality of insulating members 60 are provided in the interlayer insulating layer 11 and the stacked body 15. The insulating members 60 are located in the dividing region Rd. The insulating member 60 extends in the Y-direction and the Z-direction to divide the interconnect layer 13A. For example, the insulating member 60 includes a silicon oxide. In the example shown in FIG. 2, two insulating members 60 are disposed in the dividing region Rd along the X-direction, and a part of the interlayer insulating layer 11, a part of the interconnect layer 13A, and a part of the stacked body 15 are located between the insulating members 60.

Incidentally, the number of insulating members 60 formed in the dividing region Rd is arbitrary. Further, the cell region Rm or the first contact region Rc may include the dividing region Rd. In this case, the insulating member 60 is located in the cell region Rm or the first contact region Rc, and both sides in the X-direction with the insulating member 60 interposed therebetween correspond to two regions.

Next, elements formed in the cell region Rm, the first contact region Rc, and the dividing region Rd will be described in detail.

Figure 4:
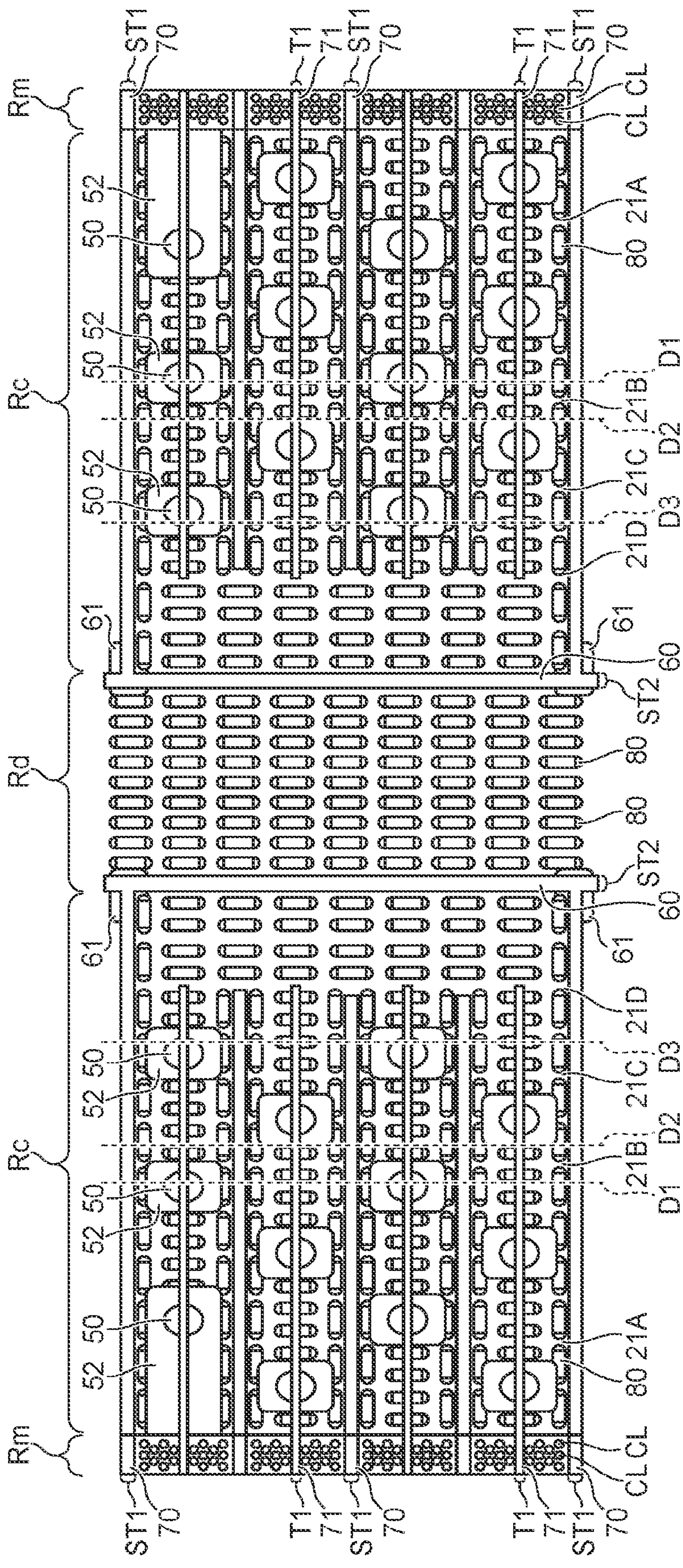
FIG. 4 is an enlarged plane view showing a region C of FIG. 2.
Figure 5:
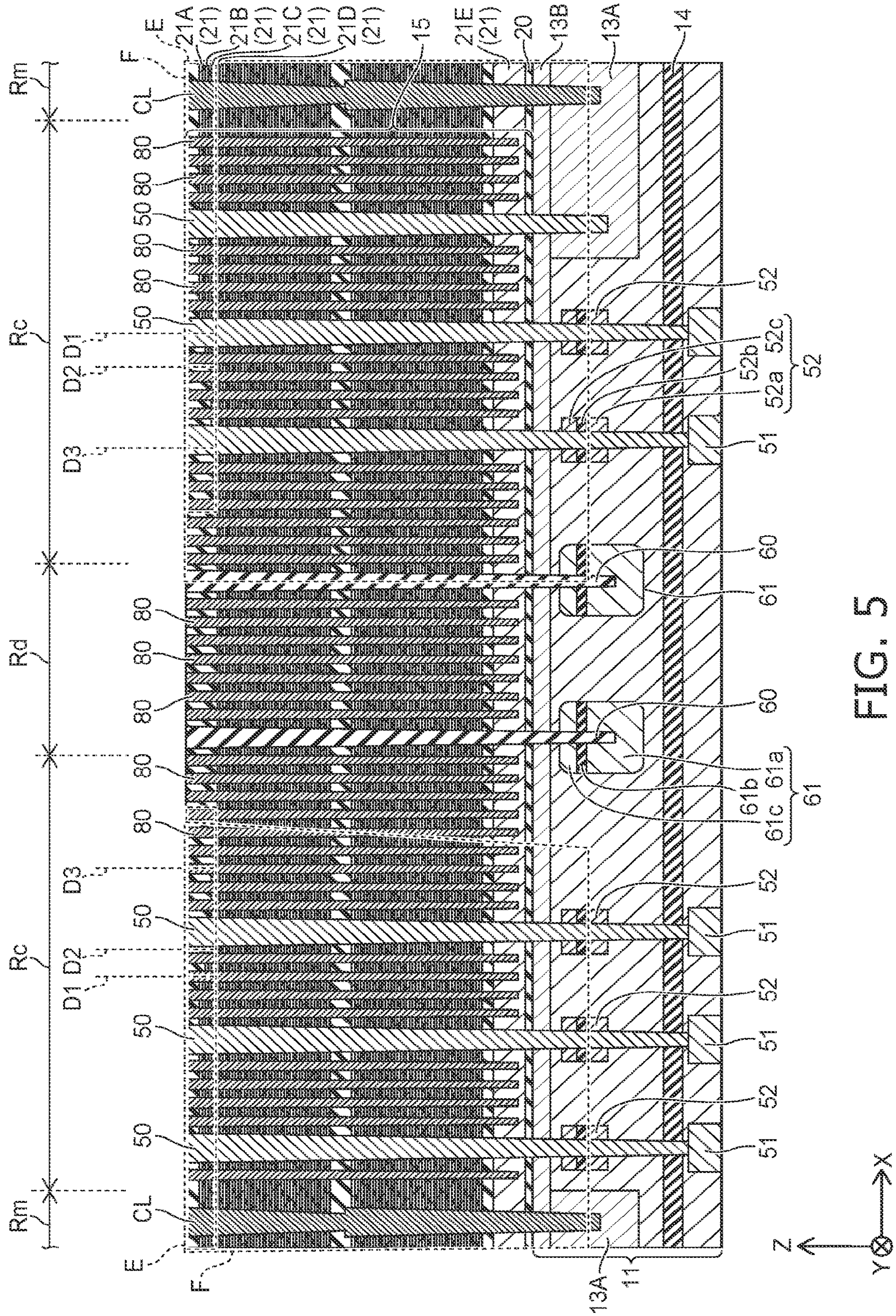
FIG. 5 is an enlarged sectional view showing a region C of FIG. 2.

FIG. 4 and FIG. 5 are an enlarged plane view and an enlarged sectional view illustrating a region C of FIG. 2, respectively.

Figure 6:
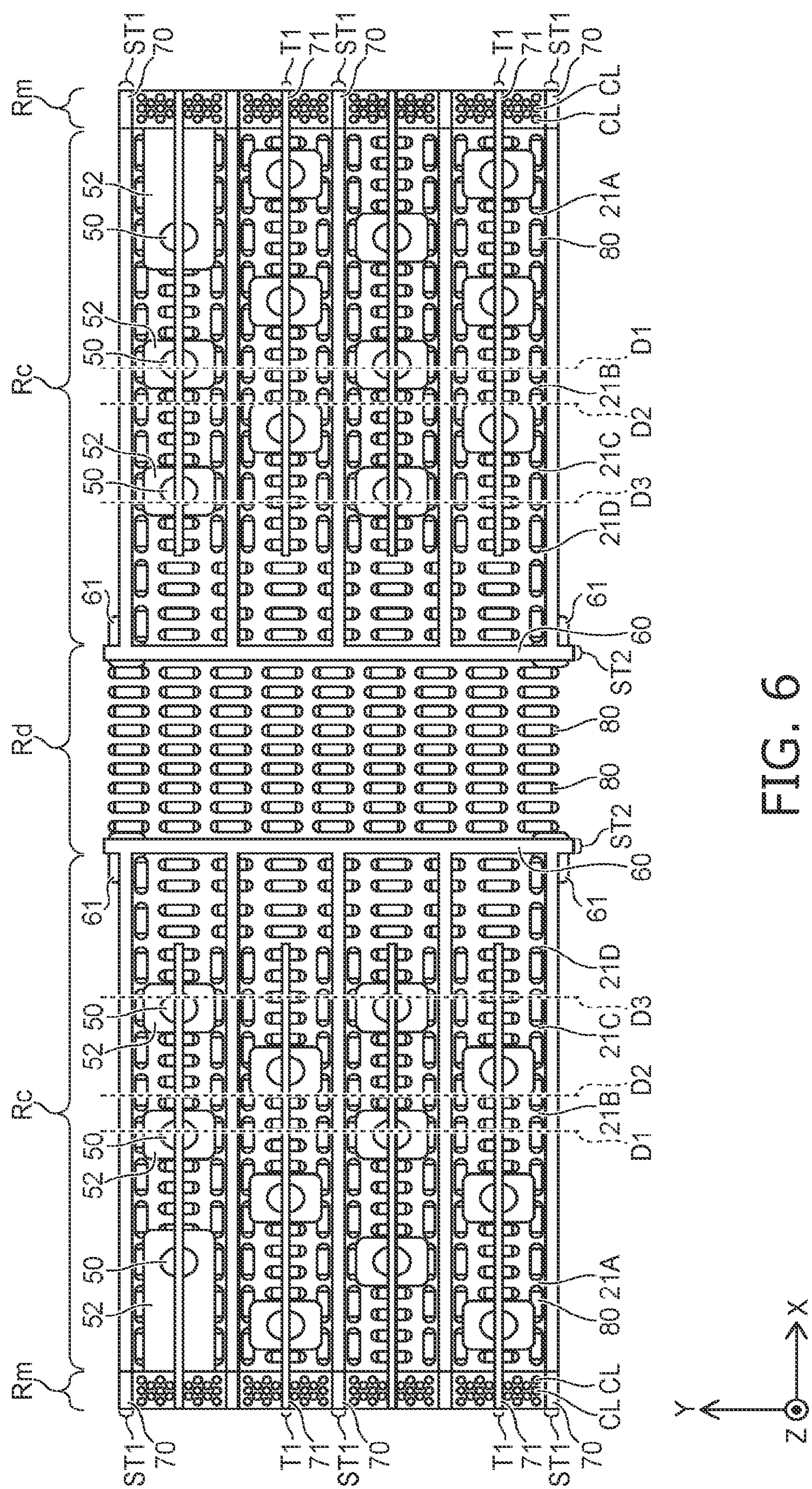
FIG. 6 is an enlarged plane view showing a part of a semiconductor memory device according to a variation of the first embodiment.
Figure 7:
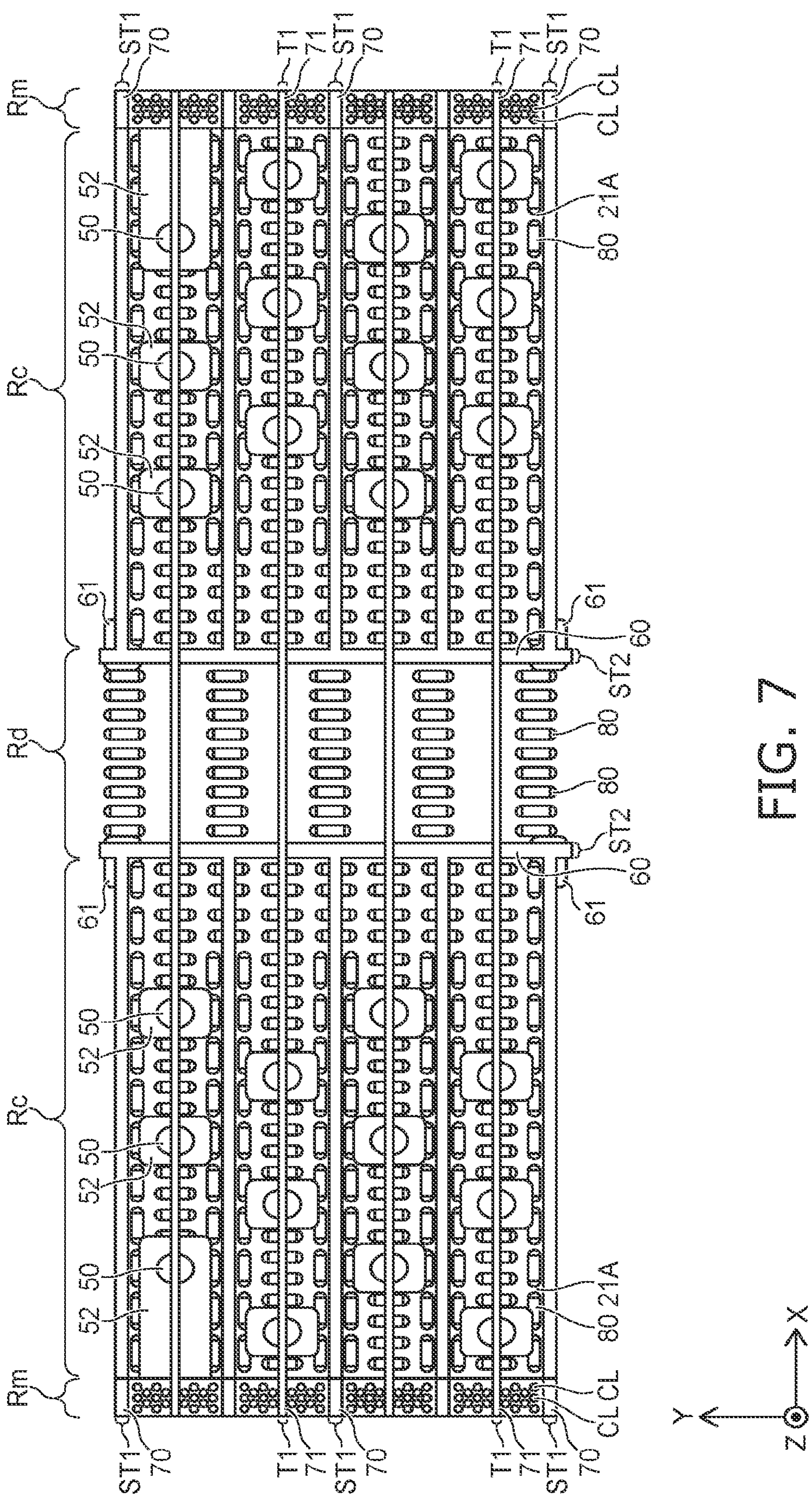
FIG. 7 is an enlarged plane view showing a part of a semiconductor memory device according to a variation of the first embodiment.

FIG. 6 and FIG. 7 are enlarged plane views each showing a part of a semiconductor memory device according to a variation of the first embodiment.

Regions shown in FIG. 6 and FIG. 7 correspond to the regions shown in FIG. 4, respectively.

As shown in FIG. 4 and FIG. 5, an insulating layer 14, a conductive layer 13B, a supporting member 52, a supporting member 61, an insulating member 70, an insulating member 71, and a supporting column portion 80 are further provided in the semiconductor memory device 1.

The insulating layer 14 is provided in the interlayer insulating layer 11. The insulating layer 14 is located in the cell region Rm, the first contact region Rc, and the dividing region Rd. The insulating layer 14 includes, for example, a silicon nitride. The piercing via 50 pierces the insulating layer 14, and the interconnect 51 is located below the insulating layer 14.

The conductive layer 13B is provided in the interlayer insulating layer 11. The conductive layer 13B is located on the interconnect layer 13A. Incidentally, for convenience of illustration, in FIG. 5, the interconnect layer 13A is located only in the cell region Rm and the piercing via 50 connected to the interconnect layer 13A in the first contact region Rc, but the interconnect layer 13A may be located in the first contact region Rc and the dividing region Rd. The conductive layer 13B includes, for example, polysilicon to which impurities are added.

For example, a thickness of the conductive layer 13B in the Z-direction is smaller than a thickness of the interconnect layer 13A in the Z-direction.

The supporting member 52 is provided in the interlayer insulating layer 11. The supporting member 52 is located in the first contact region Rc and is located between the insulating layer 14 and the conductive layer 13B. The piercing via 50 pierces the supporting member 52.

For example, the supporting member 52 is configured with a conductive portion 52*a*, an insulating portion 52*b*, and a conductive portion 52*c*. The insulating portion 52*b* is located on the conductive portion 52*a*, and the conductive portion 52*c* is located on the insulating portion 52*b*. The conductive portion 52*a* and the conductive portion 52*c* include, for example, polysilicon to which impurities are added. The insulating portion 52*b* includes, for example, a silicon oxide. Instead of forming the supporting member 52, the interlayer insulating layer 11 may be located.

The supporting member 61 is provided in the interlayer insulating layer 11. The supporting member 61 is located in the dividing region Rd between the insulating layer 14 and the conductive layer 13B. For example, at least a part of the lower end of the insulating member 60 is located in the supporting member 61.

For example, the supporting member 61 is configured with a conductive portion 61*a*, an insulating portion 61*b*, and a conductive portion 61*c*. The insulating portion 61*b* is located on the conductive portion 61*a*, and the conductive portion 61*c* is located on the insulating portion 61*b*. The conductive portion 61*a* and the conductive portion 61*c* include, for example, polysilicon to which impurities are added. The insulating portion 61*b* includes, for example, a silicon oxide. For example, the supporting member 61 is formed when the supporting member 52 is formed. The supporting member 61 may not be provided, and in this case, the lower end of the insulating member 60 is located in the interlayer insulating layer 11.

A plurality of insulating members 70 are provided in the stacked body 15 and extends in the X-direction and the Z-direction. As shown in FIG. 4, the insulating member 70 is located in a slit ST1 extending in the X-direction and the Z-direction in the cell region Rm and the first contact region Rc. For example, as shown in a region F in FIG. 5, the lower end of each of the insulating members 70 is located in the interlayer insulating layer 11 in the cell region Rm and the first contact region Rc.

The insulating member 70 includes, for example, a silicon oxide. The plurality of electrode layers 21 stacked in the Z-direction are divided into blocks (or fingers) in the Y-direction by the plurality of insulating members 70 extending in the X-direction and the Z-direction. In other words, each block corresponds to a portion between adjacent insulating members 70, and forms a word line serving as a control gate. Incidentally, instead of forming the insulating member 70, a member partially including a conductor may be formed in the slit ST1.

A plurality of insulating members 71 are provided in the stacked body 15 and extend in the X-direction. As shown in FIG. 4, the insulating member 71 is located in a groove T1 extending in the X-direction in the cell region Rm and the first contact region Rc. For example, as shown in a region E in FIG. 5, each of the insulating members 71 is located in the cell region Rm and the first contact region Rc. The insulating member 71 includes, for example, a silicon oxide.

The insulating member 71 is a portion which is disposed in an upper portion of the stacked body 15 and divides one or more electrode layers 21 from the top into two. In the examples of FIG. 4 and FIG. 5, three electrode layers 21 are divided in the Y-direction from the top by the insulating member 71. Incidentally, electrode layers 21A, 21B, 21C, and 21D correspond to an electrode layer 21 of a top layer, a second electrode layer 21 from the top, a third electrode layer 21 from the top, and a fourth electrode layer 21 from the top among the plurality of electrode layers 21. In other words, the electrode layers 21A, 21B, and 21C are divided in the Y-direction by the insulating member 71. Incidentally, the number of electrode layers 21 divided in the Y-direction is arbitrary.

As shown in dashed lines D1 to D3 in FIG. 4 and FIG. 5, a shape of the stacked body 15 located between the dashed line D1 and the dashed line D3 is a step shape. Since the shape of the stacked body 15 between the dashed line D1 and the dashed line D3 is the step shape, steps and terraces are formed in each of the electrode layer 21B between the dashed line D1 and the dashed line D2 and the electrode layer 21C between the dashed line D2 and the dashed line D3. The insulating member 71 extending in the X-direction does not intersect with the insulating member 60 extending in the Y-direction. Since the shape of the stacked body 15 between the dashed line D1 and the dashed line D3 is the step shape, each of the electrode layers 21A, 21B, and 21C can be divided in the Y-direction by the insulating member 71.

A plurality of supporting column portions 80 are provided in the stacked body 15 and extend in the Z-direction. The supporting column portion 80 is located in the first contact region Rc and the dividing region Rd. For example, as shown in FIG. 4, the plurality of supporting column portions 80 are disposed in the first contact region Rc and the dividing region Rd along the X-direction and the Y-direction. For example, as shown in FIG. 5, a lower end of each of the supporting column portions 80 is located in an electrode layer 21 E in the first contact region Rc and the dividing region Rd. Incidentally, the electrode layer 21E corresponds to the electrode layer 21 of the bottom layer among the plurality of electrode layers 21. The supporting column portion 80 includes, for example, a silicon oxide. The supporting column portion 80 functions to support the stacked body 15.

The insulating member 60 is located in a slit ST2 extending in the Y-direction and the Z-direction in the dividing region Rd. The insulating member 60 extending in the Y-direction intersects with at least some of the plurality of insulating members 70 extending in the X-direction. For example, as shown in FIG. 4, the insulating member 60 intersects with the two insulating members 70 located at both ends in the Y-direction, but as shown in FIG. 6, the insulating member 60 may intersect with all of the plurality of insulating members 70. For example, when viewed in the Z-direction, the insulating member 60 and the insulating member 70 intersect in a letter T shape. When viewed in the Z-direction, the insulating member 60 and the insulating member 70 may intersect in a cross shape, and for example, one insulating member 60 may be formed in the dividing region Rd to intersect with the insulating member 70 in a cross shape.

Further, as described above, the insulating member 60 extending in the Y-direction does not intersect with the insulating member 71 extending in the X-direction, but the insulating member 60 may intersect with all of the plurality of insulating members 71. For example, as shown in FIG. 7, when viewed in the Z-direction, the insulating member 60 and the insulating member 71 intersect in the cross shape. When viewed in the Z-direction, the insulating member 60 and the insulating member 71 may intersect in a letter T shape. In a case in which the insulating member 60 intersects with all of the plurality of insulating members 71 as shown in FIG. 7, the shape of the stacked body 15 between the dashed line D1 and the dashed line D3 of FIG. 5 may not be processed into a step shape. In other words, since the insulating member 60 intersects with all of the plurality of insulating members 71, the electrode layers 21A, 21B, and 21C are divided in the Y-direction in a portion located between the insulating member 60 and the insulating member 71. Further, in the example of FIG. 7, the insulating member 60 intersects with all of the plurality of insulating members 70. Incidentally, in FIG. 7, instead of the insulating member 60 intersecting with all of the plurality of insulating members 70, for example, the insulating members 70 not intersecting with the insulating member 60 may be connected by the insulating member 71.

Further, the plurality of supporting column portions 80 are disposed between the two insulating members 60 along the X-direction and the Y-direction.

Next, elements formed in the dividing region Rd will be described in more detail.

Figure 8:
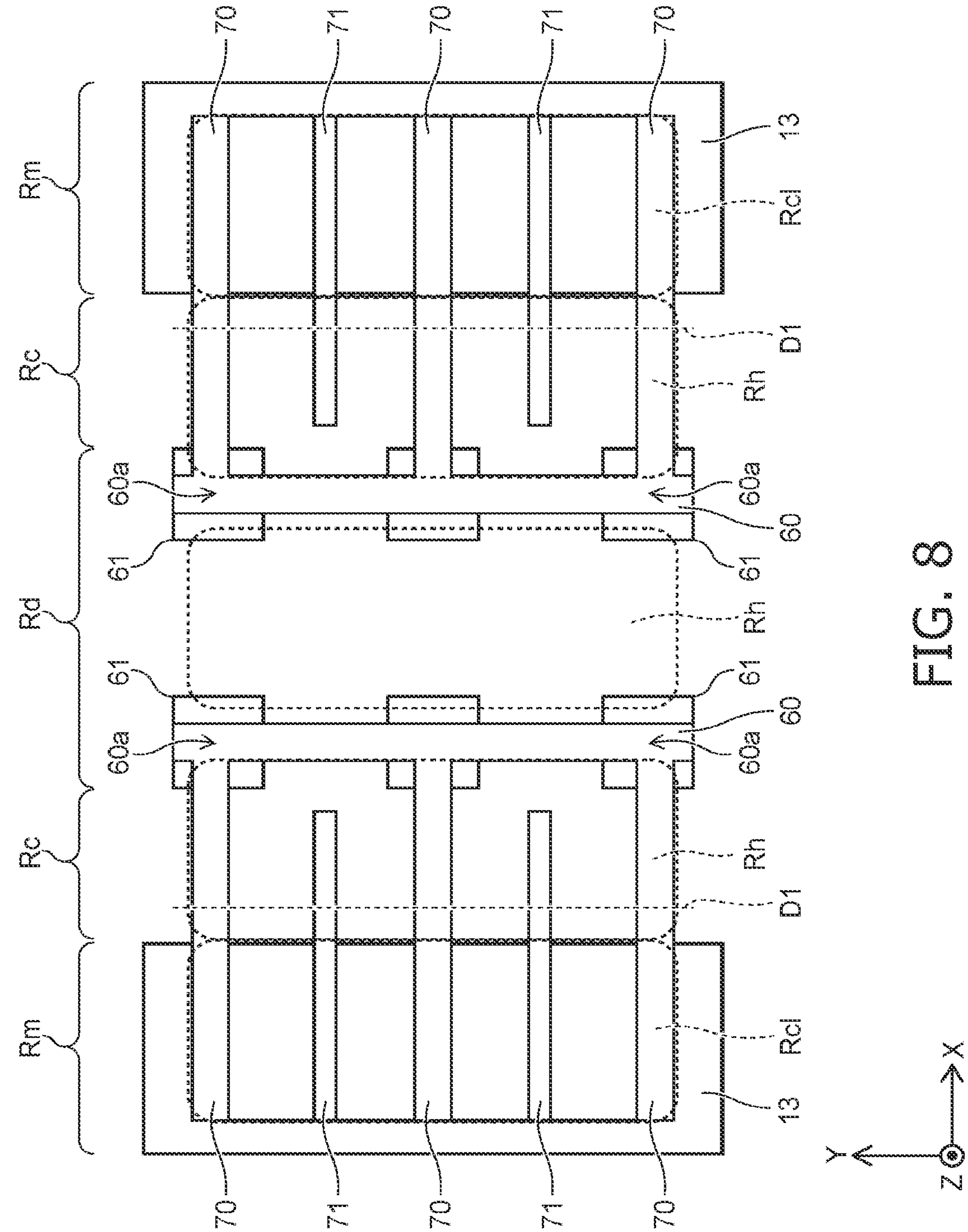
FIG. 8 is an enlarged plane view showing a part of the semiconductor memory device according to the first embodiment.
Figure 9:
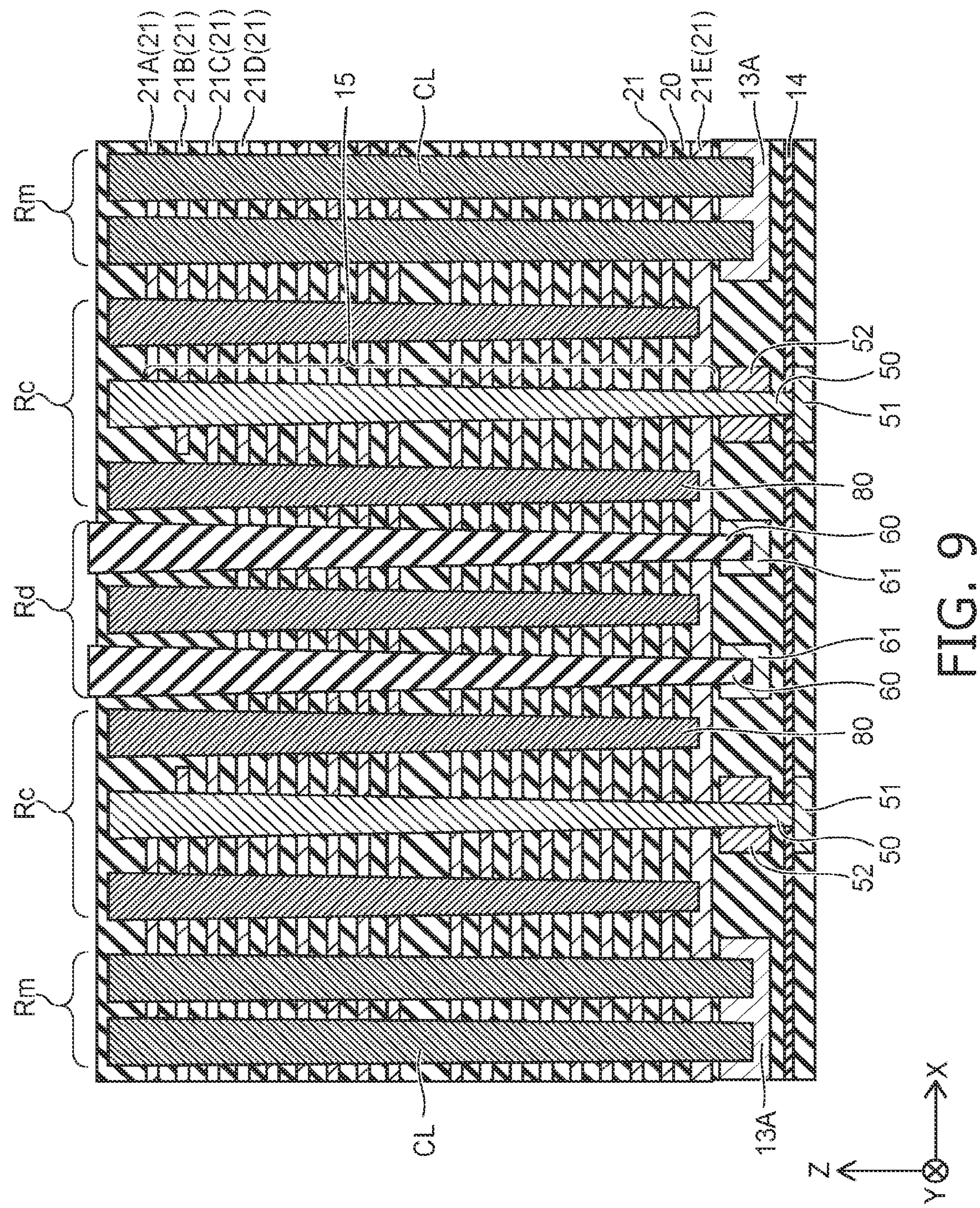
FIG. 9 is an enlarged sectional view showing a part of the semiconductor memory device according to the first embodiment.

FIG. 8 and FIG. 9 are an enlarged plane view and an enlarged sectional view showing the dividing region Rd, respectively.

The regions shown in FIG. 8 and FIG. 9 correspond to the regions shown in FIG. 4 and FIG. 5 and correspond to views obtained by simplifying FIG. 4 and FIG. 5.

As shown in FIG. 8 and FIG. 9, the plurality of supporting column portions 80 are provided in the stacked body 15, and extend in the Z-direction. The supporting column portion 80 is located in the first contact region Rc and the dividing region Rd. In other words, as shown in FIG. 8, each of the first contact region Rc and the dividing region Rd includes a region Rh in which the supporting column portion 80 is formed. Further, the cell region Rm includes a region Rcl in which the columnar portion CL is formed.

The insulating member 60 intersects with the insulating member 70 and does not intersect with the insulating member 71. The insulating member 60 includes an intersecting portion 60*a* intersecting with the insulating member 70. The supporting member 61 may be provided to correspond to the intersecting portion 60*a*. In other words, when viewed in the Z-direction, the supporting member 61 may be located in the dividing region Rd to overlap the intersecting portion 60*a*. For example, the supporting member 61 is located in an island shape in the dividing region Rd. For example, in the intersecting portion 60*a*, at least a part of the conductive portion 61*a* of the supporting member 61 may be removed, so that a cavity is formed.

For example, the intersecting portion 60*a* may be disposed in the first contact region Rc, and in this case, for example, the supporting member 61 may not be provided in the intersecting portion 60*a*. For example, in a case in which the supporting member 61 is provided in the intersecting portion 60*a*, the intersecting portion 60*a* is disposed in the first contact region Rc in which the interconnect layer 13A is divided.

Further, the intersecting portion 60*a* may be disposed in the cell region Rm, and in this case, for example, the supporting member 61 may not be provided in the intersecting portion 60*a*, and the first contact region Rc between the cell region Rm and the dividing region Rd may not be provided.

Next, a memory characteristic of the semiconductor memory device 1 will be described.

Figure 10:
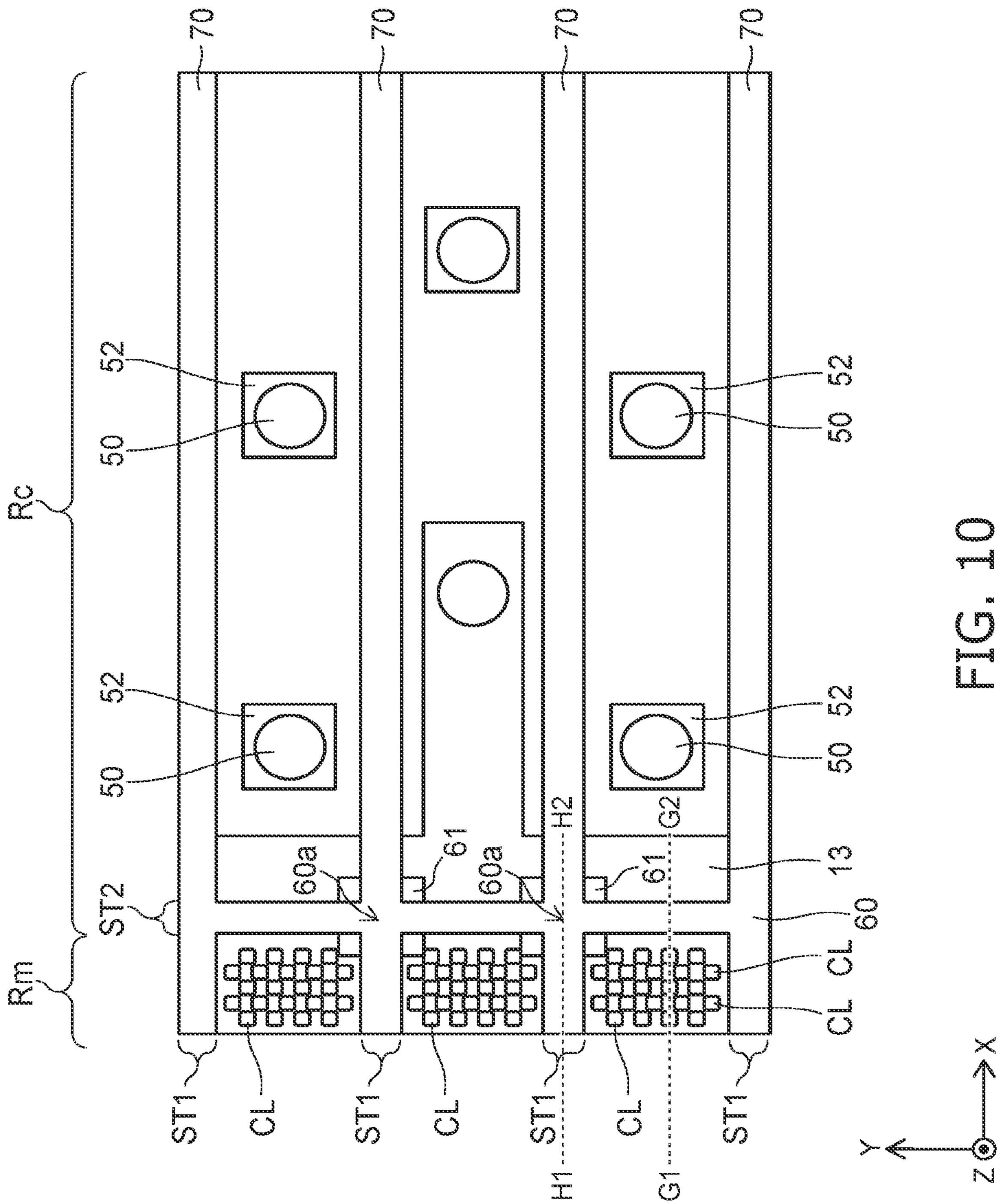
FIG. 10 is a plane view showing the semiconductor memory device according to the first embodiment.

FIG. 10 is a plane view showing the semiconductor memory device 1.

As shown in FIG. 10, the semiconductor memory device 1 is divided into a plurality of regions by the insulating member 70 formed in the slit ST1 and the insulating member 60 formed in the slit ST2. For example, the insulating member 70 of FIG. 10 corresponds to the insulating member 70 intersecting with the insulating member 60 of FIG. 4, and the insulating member 60 of FIG. 10 corresponds to the insulating member 60 of FIG. 4. A region (finger) divided by the insulating member 70 not intersecting with the insulating member 60 of FIG. 4 is included between the insulating members 70 of FIG. 10. In FIG. 10, for example, memory capacities Mc of the regions divided by the insulating member 60 and the insulating member 70 are substantially the same.

The electrode layer 21 (word line) between the insulating members 70 is divided into two by the two insulating members 60. In the step region Rs, the electrode layer 21 (word line) between the insulating members 70 is led to the outside of the stacked body 15 via a contact on a terrace (the terrace 21T of FIG. 2).

In the semiconductor memory device 1, a large number of memory cells each including the charge storage film 42 are disposed in a three-dimensional lattice pattern along the X-direction, the Y-direction, and the Z-direction to constitute the memory cell array, and data can be stored in each memory cell.

Next, a method of manufacturing the semiconductor memory device according to the embodiment will be described.

First, the circuit portion 12, the insulating layer 14, the interconnect layer 13A, and the conductive layer 13B are sequentially formed on the substrate 10. For example, the supporting member 52 and the supporting member 61 are formed when the interconnect layer 13A and the conductive layer 13B are formed.

Then, after the interlayer insulating layer 11 is formed, the insulating layers 20 and sacrificial layers are alternately stacked on the interlayer insulating layer 11, so that the stacked body is formed. The insulating layer 20 is formed by a silicon oxide, and the sacrificial layer is formed by a silicon nitride.

Then, both ends of the stacked body in the X-direction are processed in the step shape to form the columnar portion CL, the piercing via 50, and the supporting column portion 80 which pierce the inside of the stacked body. Further, in the first contact region Rc between the cell region Rm and the dividing region Rd shown in FIG. 4, the upper portion of the stacked body is processed in the step shape to form the groove T1 extending in the X-direction.

Then, a plurality of slits ST1 extending in the X-direction and the Z-direction and a plurality of slits ST2 extending in the Y-direction and the Z-direction are formed in the stacked body through by an etching process such as RIE. Then, wet etching is performed through the slits ST1 and ST2 to remove the sacrificial layer of the stacked body. For example, phosphoric acid is used as an etchant for wet etching. Then, metal such as tungsten is deposited in the cavity formed by removing the sacrificial layer via the slits ST1 and ST2 to form the electrode layer 21. Accordingly, the stacked body 15 is formed.

Here, if a replacement process of removing the sacrificial layer is performed in the configuration in which the groove T1 intersects with the slit ST2, the etching process is easily performed around the vicinity of the intersecting portion of the groove T1 and the slit ST2. Accordingly, metal such as tungsten may remain in the cavity formed by excessive removal, and a breakdown voltage around the vicinity of the intersecting portion may be lowered. Therefore, in a case in which the replacing process is performed, it is desired that the groove T1 and the slit ST2 do not intersect with each other.

Then, the silicon oxide or the like is embedded in the slits ST1, ST2 through, for example, a chemical vapor deposition (CVD) technique to form the insulating members 70 and 60. Further, the silicon oxide or the like is embedded in the groove T1 to form the insulating member 71.

As described above, the semiconductor memory device 1 is manufactured.

Next, effects of the embodiment will be described.

In the semiconductor memory device of the three-dimensional structure, in the step region, the electrode layer (word line) of the stacked body and the peripheral circuit are electrically connected via the contact and the interconnect. The contact and the interconnect are led to the outside of the stacked body so that the electrode layer (word line) is driven on one side, for example, at one end in the X-direction. In a case in which the electrode layer is driven at one end in the X-direction, the semiconductor memory device has a structure in which the electrode layer is long in the X-direction. In addition to the structure of the electrode layer, the resistance value of the electrode layer is likely to increase as the number of stacked layers in the stacked body increases or the pitch in the electrode layer decreases.

Here, in order to decrease the resistance value of the electrode layer, a method of causing the periphery of the center of the stacked body to have the step shape, dividing the electrode layer, and reducing the length of the electrode layer in the X-direction is considered. However, in this case, since both ends of the stacked body in the X-direction also have the step shape, and the steps of both ends of the electrode layer in the X-direction correspond to steps (dummy steps) in which no contact and interconnect are formed, the size of the semiconductor memory device is likely to increase. Further, in a case in which the periphery of the center of the stacked body has the step shape, since the process is complicated, the number of processes may increase. Further, a structural strength of the region (for example, the finger) of the stacked body (the electrode layer) divided by the slit is likely to decrease, and the stacked body is likely to be deformed.

In the semiconductor memory device 1 of the embodiment, the insulating member 60 extending in the stacked body 15 in the Y-direction is provided in the dividing region Rd located between the cell regions Rm in the X-direction. Since the electrode layer 21 extending in the X-direction is divided around the vicinity of the center in the semiconductor memory device 1 by the insulating member 60, the length of the electrode layer 21 in the X-direction can be reduced. Accordingly, the resistance value of the electrode layer 21 can be lowered to thereby improve the electrical characteristic of the semiconductor memory device 1.

Further, in the semiconductor memory device 1 of the embodiment, since the periphery of the center of the stacked body does not have the step shape (that is, both ends in the X-direction do not include dummy steps), the size of the semiconductor memory device 1 can be reduced. Further, it is easy to manufacture the semiconductor memory device 1, and it is possible to prevent the structural strength of the region (for example, the finger) of the stacked body 15 (the electrode layer 21) divided by the slit ST1 from being lowered and thereby prevent the stacked body 15 from being deformed.

According to the embodiment, the semiconductor memory device with the improved electrical characteristic is provided.

Second Embodiment

Figure 11:
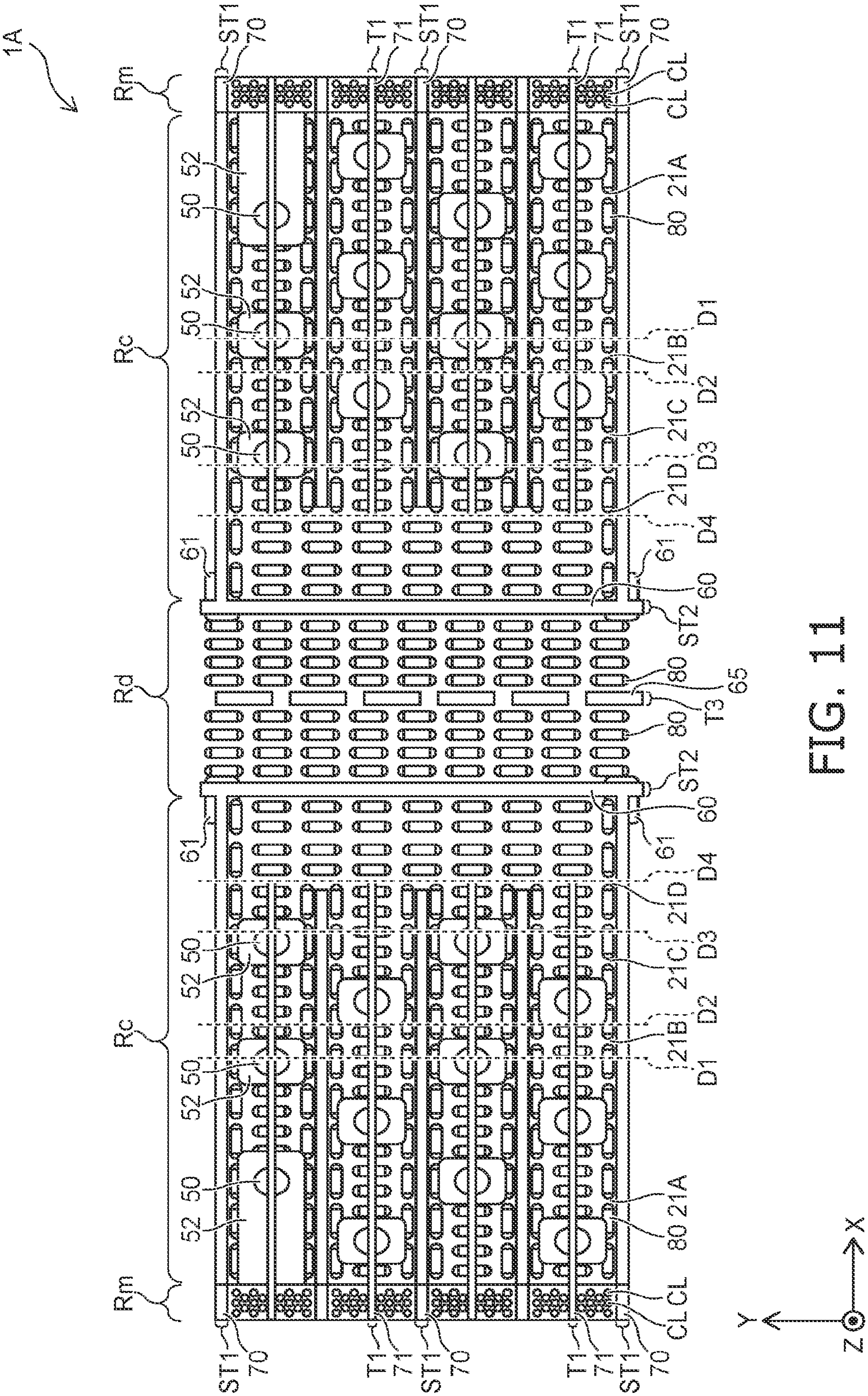
FIG. 11 is an enlarged plane view showing a part of a semiconductor memory device according to a second embodiment.
Figure 12:
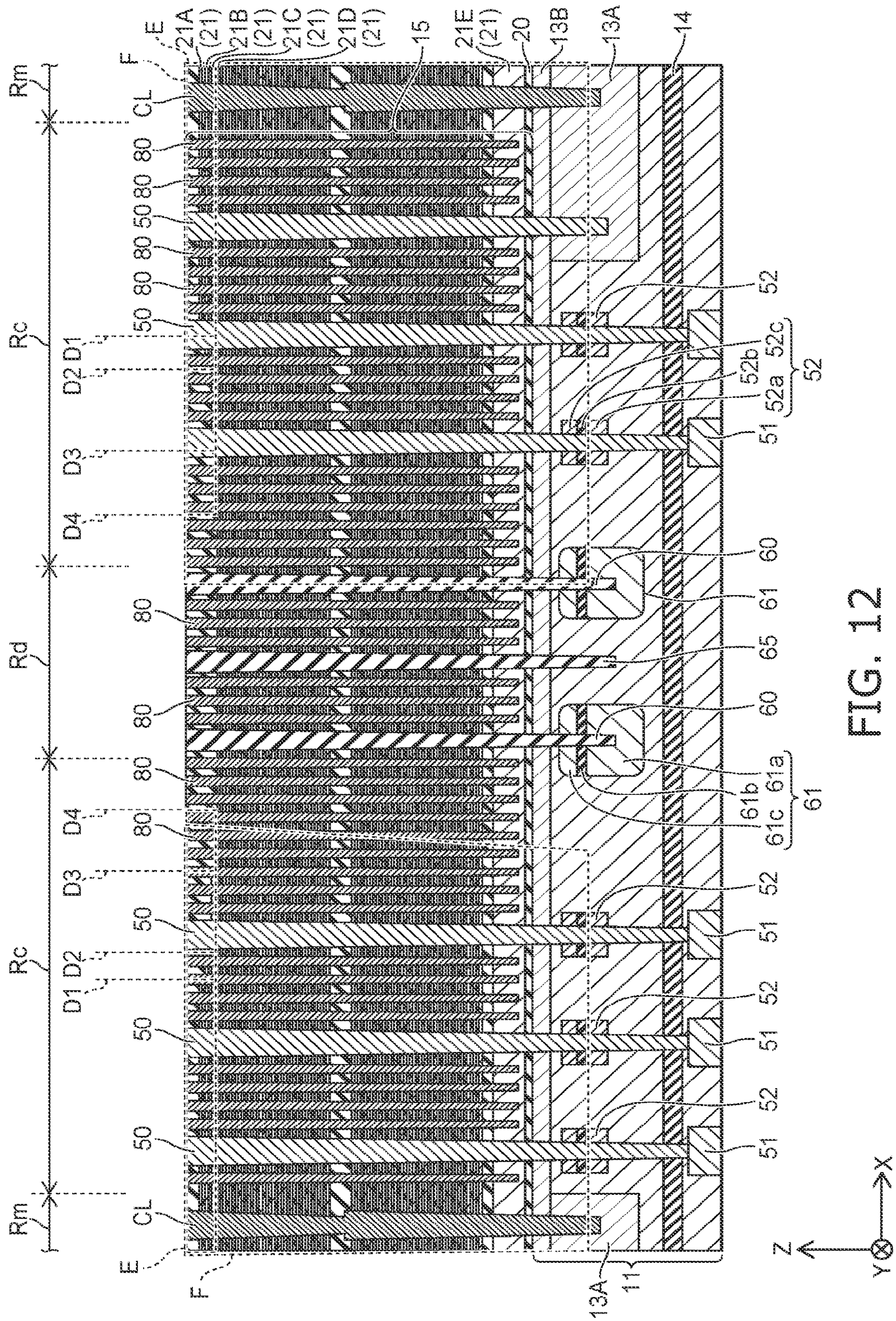
FIG. 12 is an enlarged sectional view showing a part of the semiconductor memory device according to the second embodiment.

FIG. 11 and FIG. 12 are an enlarged plane view and an enlarged sectional view showing a part of a semiconductor memory device 1A, respectively.

Regions shown in FIG. 11 and FIG. 12 correspond to the regions shown in FIG. 4 and FIG. 5, respectively.

The semiconductor memory device 1A according to the embodiment is different from the semiconductor memory device 1 of the first embodiment in an insulating member 65. Since the remaining configuration is the same as that of the first embodiment, detailed description thereof will be omitted.

As shown in FIG. 11 and FIG. 12, the semiconductor memory device 1A includes an interlayer insulating layer 11, an interconnect layer 13A, a conductive layer 13B, an insulating layer 14, a stacked body 15, a columnar portion CL, a piercing via 50, a supporting member 52, an insulating member 60, a supporting member 61, the insulating member 65, an insulating member 70, an insulating member 71, and a supporting column portion 80.

A plurality of insulating members 65 are provided in the interlayer insulating layer 11 and the stacked body 15. The plurality of insulating members 65 are located in the dividing region Rd. The plurality of insulating members 65 are located, for example, in a plurality of grooves T3. The plurality of insulating members 65 are disposed to be spaced from each other between the insulating members 60 in the Y-direction along the insulating member 60. For example, the plurality of insulating members 65 are disposed from one end to the other end in the Y-direction along the insulating member 60. A shape of the insulating member 65 is, for example, a rectangular parallelepiped shape. For example, each of the plurality of insulating members 65 includes a silicon oxide.

Incidentally, in the embodiment, the plurality of insulating members 65 are disposed to be spaced from each other in the Y-direction along the insulating member 60, but the number of insulating members 65 to be disposed is arbitrary.

Next, effects of the embodiment will be described.

In the semiconductor memory device 1A according to the embodiment, the plurality of insulating members 65 are provided in the stacked body 15 along the Y-direction between the insulating members 60 in the dividing region Rd. With such an insulating member 65, it is possible to prevent the structural strength of the region (for example, the finger) of the stacked body 15 (the electrode layer 21) divided by the slit ST1 from being lowered and thereby prevent the stacked body 15 from being deformed.

Incidentally, the other effects of the second embodiment are the same as those of the first embodiment.

Third Embodiment

Figure 13:
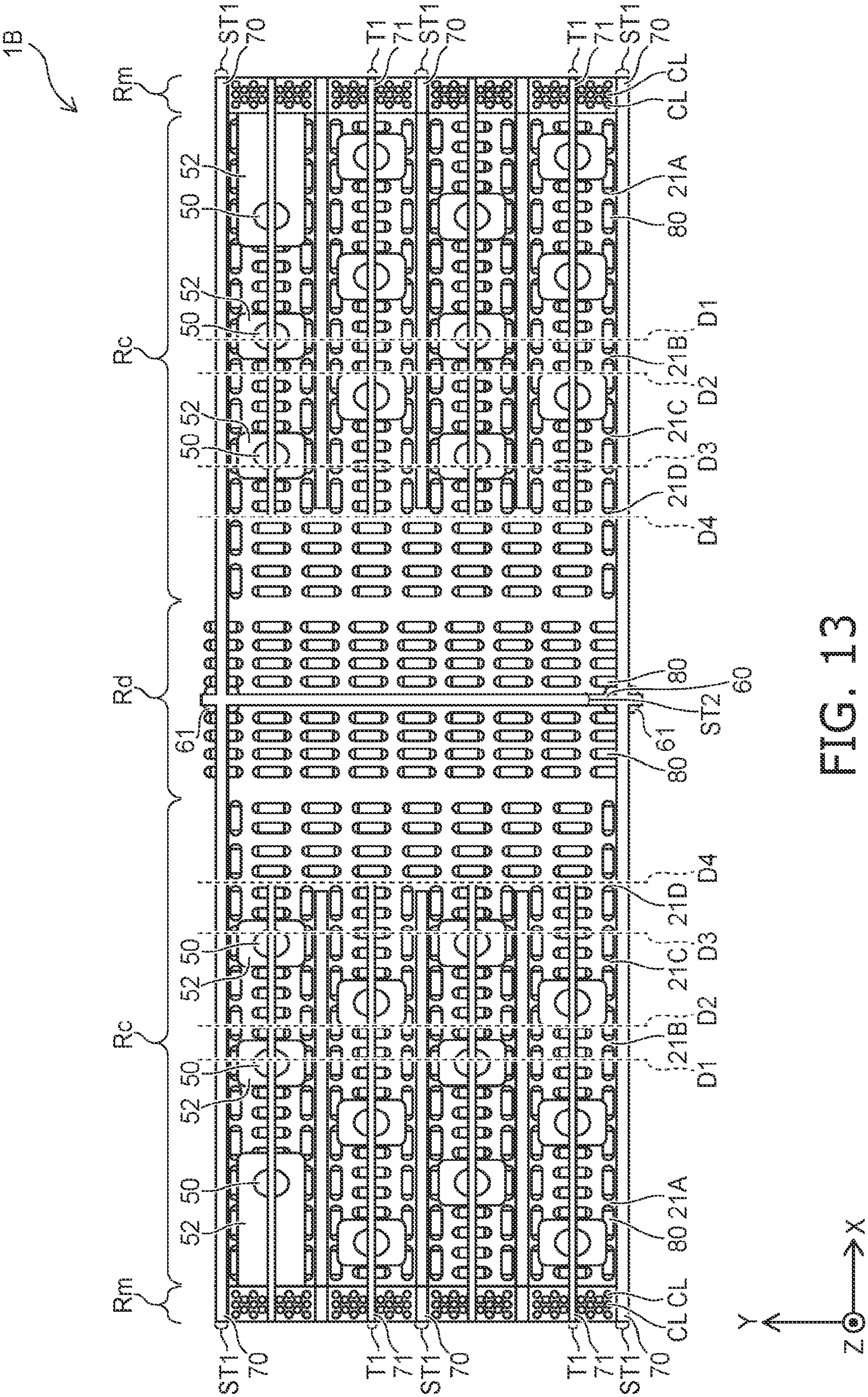
FIG. 13 is an enlarged plane view showing a part of a semiconductor memory device according to a third embodiment.
Figure 14:
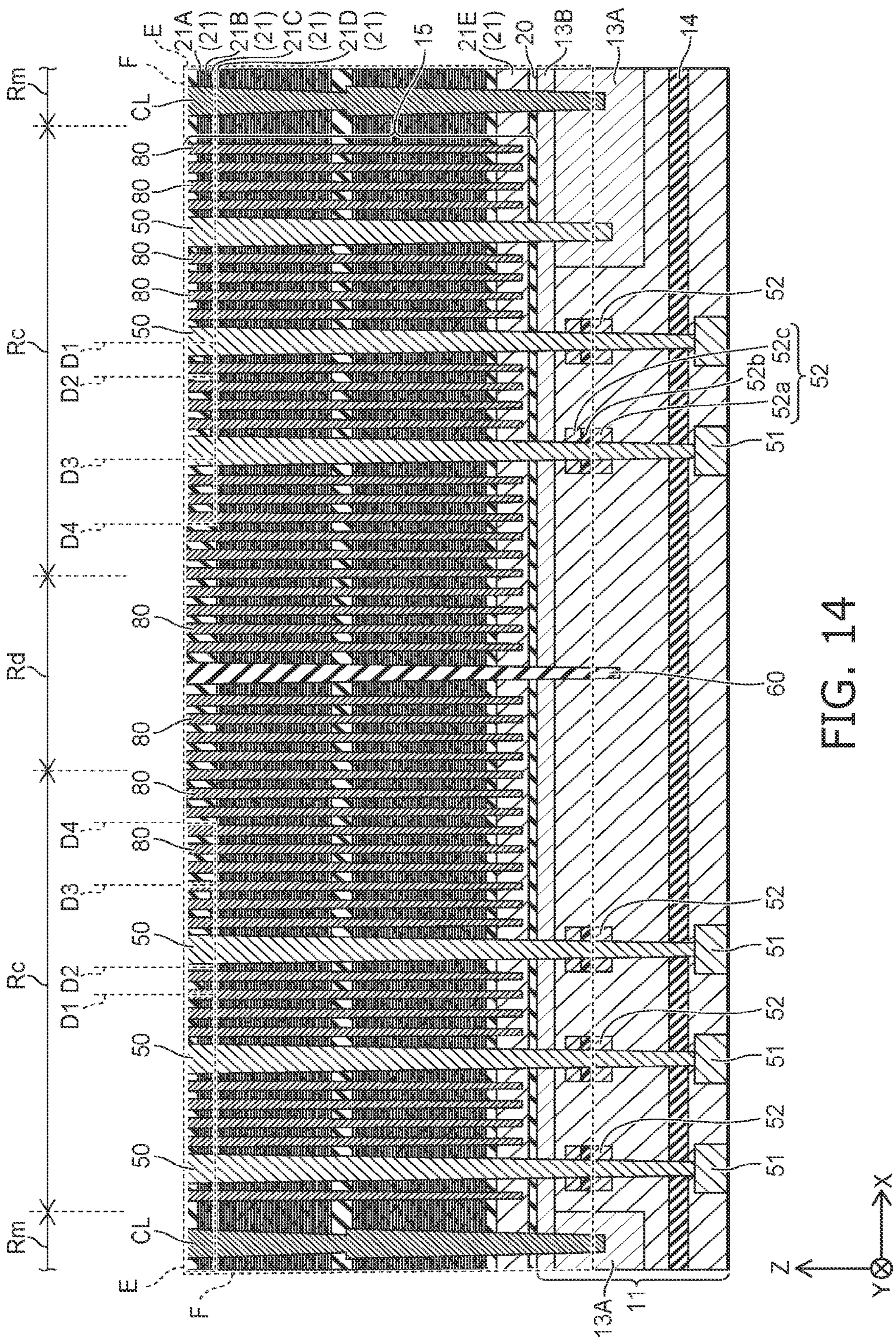
FIG. 14 is an enlarged sectional view showing a part of the semiconductor memory device according to the third embodiment.

FIG. 13 and FIG. 14 are an enlarged plane view and an enlarged sectional view showing a part of a semiconductor memory device 1B, respectively.

Regions shown in FIG. 13 and FIG. 14 correspond to the regions shown in FIG. 4 and FIG. 5, respectively.

The semiconductor memory device 1B according to the embodiment is different from the semiconductor memory device 1 of the first embodiment in a configuration of the insulating member 60. Since the remaining configuration is the same as that of the first embodiment, detailed description thereof will be omitted.

As shown in FIG. 13 and FIG. 14, the semiconductor memory device 1B includes an interlayer insulating layer 11, an interconnect layer 13A, a conductive layer 13B, an insulating layer 14, a stacked body 15, a columnar portion CL, a piercing via 50, a supporting member 52, an insulating member 60, a supporting member 61, an insulating member 70, an insulating member 71, and a supporting column portion 80.

The insulating member 60 is provided in the interlayer insulating layer 11 and the stacked body 15. The insulating member 60 is located in the dividing region Rd. The insulating member 60 is located in the slit ST2 extending in the Y-direction and the Z-direction. The insulating member 60 extending in the Y-direction intersects with at least some of a plurality of insulating members 70 extending in the X-direction. For example, as shown in FIG. 13, the insulating member 60 intersects with the two insulating members 70 located at both ends in the Y-direction. The insulating member 60 may intersect with all of the plurality of insulating members 70. For example, when viewed in the Z-direction, the insulating member 60 and the insulating member 70 intersect in a cross shape.

Incidentally, effects of the third embodiment are the same as those of the first embodiment.

Fourth Embodiment

Figure 15:
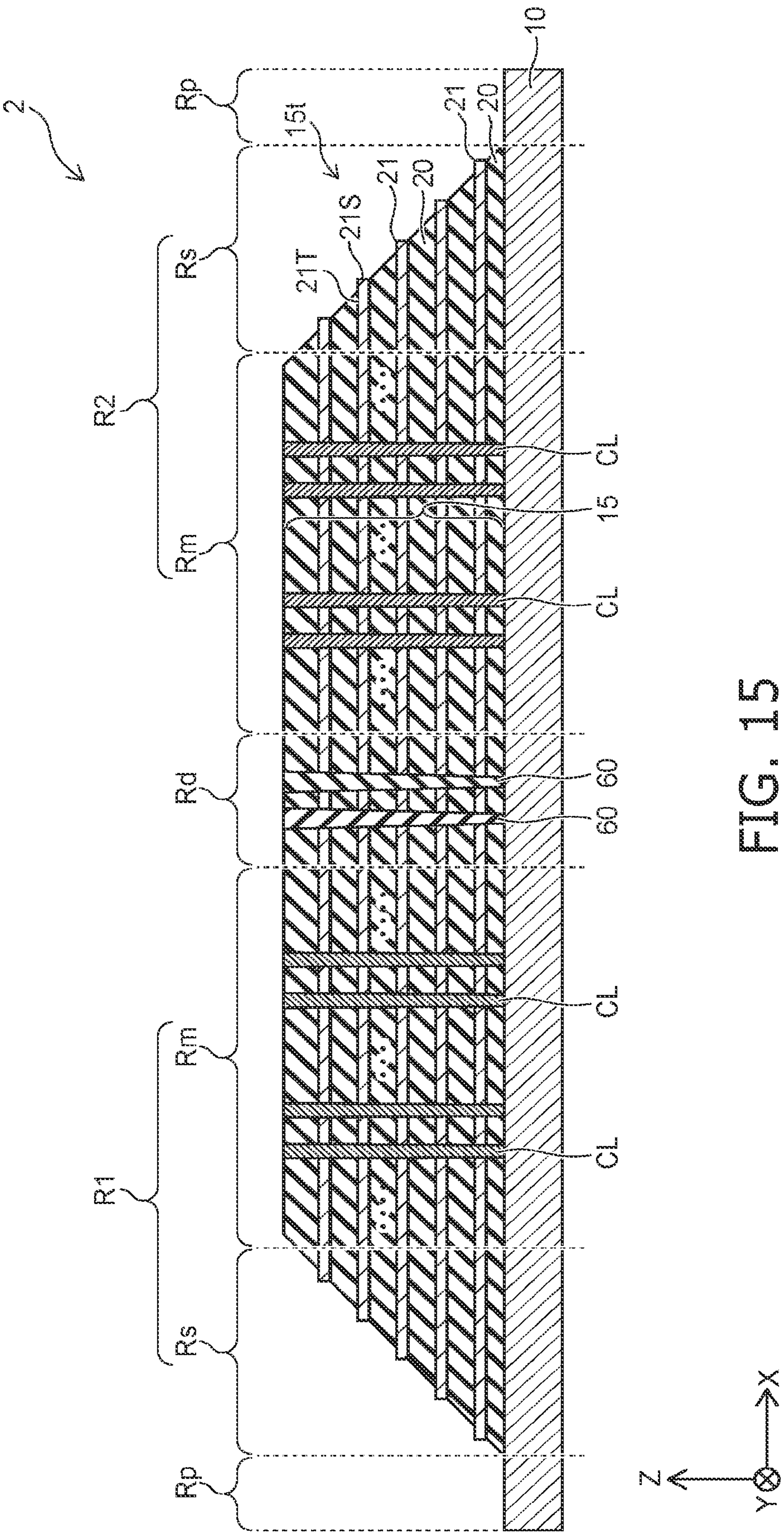
FIG. 15 is a sectional view showing a semiconductor memory device according to a fourth embodiment.

FIG. 15 is a cross-sectional view showing a semiconductor memory device 2.

A region shown in FIG. 15 corresponds to the region shown in FIG. 2.

As shown in FIG. 15, a cell region Rm, a step region Rs, a dividing region Rd, and a peripheral region Rp are provided in the semiconductor memory device 2.

A memory cell array including a plurality of memory cells is provided in the cell region Rm.

For example, a plurality of contacts extending in the Z-direction are provided in the step region Rs.

A plurality of insulating members 60 extending in the Y-direction and the Z-direction are provided in the dividing region Rd.

A peripheral circuit (not shown) is provided in the peripheral region Rp. For example, the peripheral circuit is electrically connected to a plurality of electrode layers 21 of a step shape. In the embodiment, a circuit portion 12 disposed under the memory cell is not provided, and the peripheral region Rp in which the peripheral circuit is formed is located outside the step region Rs.

In the example shown in FIG. 15, a region R1 is configured with the cell region Rm and the step region Rs located at one end in the X-direction. Further, a region R2 is configured with the cell region Rm and the step region Rs located at the other end in the X-direction.

Further, the dividing region Rd is provided around the vicinity of the center in the semiconductor memory device 2 between the region R1 and the region R2. The region R1 and the region R2 are divided by the dividing region Rd.

As shown in FIG. 15, a substrate 10, a stacked body 15, a columnar portion CL, and the insulating member 60 are provided in the semiconductor memory device 2.

The stacked body 15 is provided on the substrate 10. A plurality of insulating layers 20 and the plurality of electrode layers 21 are provided in the stacked body 15, and the insulating layer 20 and the electrode layer 21 are alternately stacked on each layer in the Z-direction.

Further, an end portion 15*t* of the stacked body 15 is located in the step region Rs. A shape of the end portion 15*t* of the stacked body 15 is a step shape in which a step 21S and a terrace 21T are formed in the electrode layer 21. In the end portion 15*t* of the stacked body 15, a contact (not shown) extending in the Z-direction is provided on the terrace 21T of the electrode layer 21. The electrode layer 21 is electrically connected to a peripheral circuit located around the periphery of the step region Rs via the contact.

The columnar portion CL is provided in the stacked body 15. The columnar portion CL is located in the cell region Rm. The columnar portion CL is located in a memory hole extending in the Z-direction. The columnar portion CL includes a core insulating film 31, a channel 32, a tunnel insulating film 41, a charge storage film 42, and a block insulating film 43 (see FIG. 3).

The plurality of insulating members 60 are provided in the stacked body 15. The insulating member 60 is located in the dividing region Rd. In the example shown in FIG. 15, in the dividing region Rd, two insulating members 60 are disposed along the X-direction, and a part of the stacked body 15 is located between the insulating members 60.

Incidentally, the number of insulating members 60 formed in the dividing region Rd is arbitrary. Further, the cell region Rm may include the dividing region Rd. In this case, the insulating member 60 is located in the cell region Rm, and both sides in the X-direction with the insulating member 60 interposed therebetween correspond to two regions.

Next, elements formed in the dividing region Rd will be described in detail.

Figure 16:
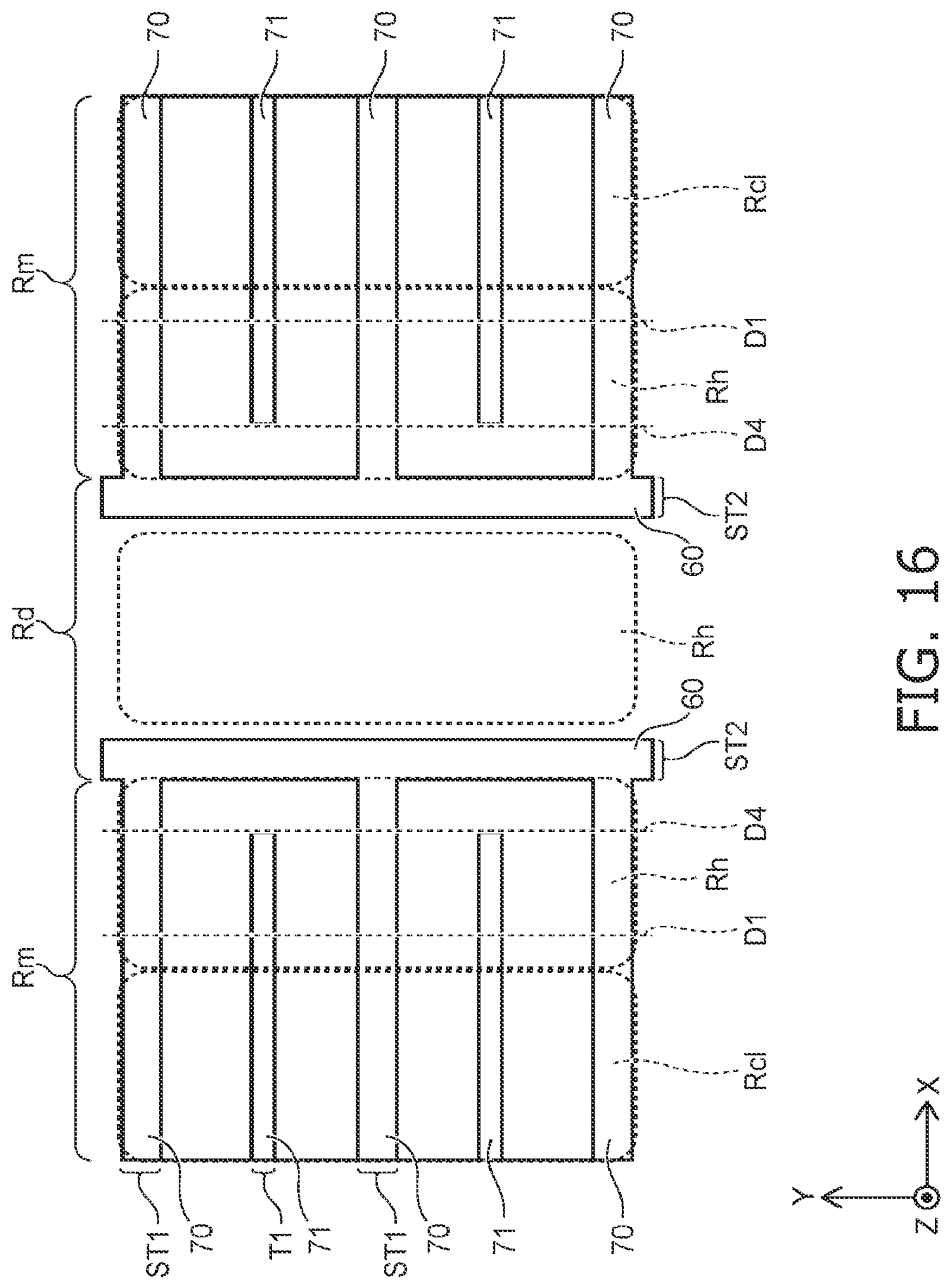
FIG. 16 is an enlarged plane view showing a part of the semiconductor memory device according to the fourth embodiment.
Figure 17:
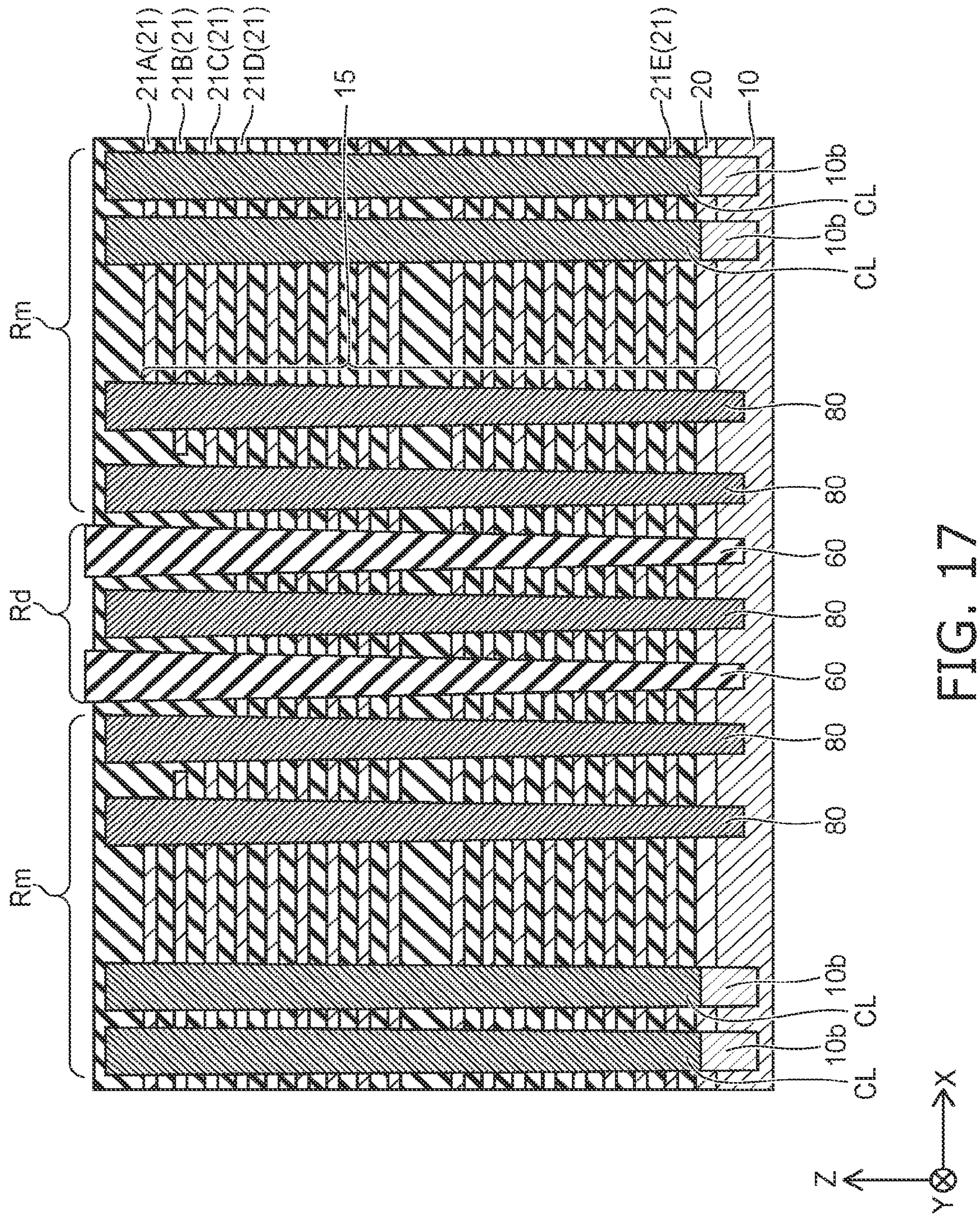
FIG. 17 is an enlarged sectional view showing a part of the semiconductor memory device according to the fourth embodiment.

FIG. 16 and FIG. 17 are an enlarged plane view and an enlarged sectional view showing the dividing regions Rd, respectively.

Incidentally, FIG. 16 shows a configuration in which the insulating member 60 extending in the Y-direction intersects with all of a plurality of insulating members 70 extending in the X-direction and does not intersect with insulating members 71 extending in the X-direction.

As shown in FIG. 16 and FIG. 17, the insulating member 70, the insulating member 71, and a supporting column portion 80 are further provided in the semiconductor memory device 2.

The plurality of insulating members 70 are provided in the stacked body 15 and extend in the X-direction and the Z-direction. As shown in FIG. 16, the insulating member 70 is located in a slit ST1 extending in the X-direction and the Z-direction in the cell region Rm. For example, the lower end of the insulating member 70 is located on the substrate 10.

A plurality of insulating members 71 are provided in the stacked body 15 and extend in the X-direction. As shown in FIG. 16, the insulating member 71 is located in a groove T1 extending in the X-direction in the cell region Rm. A shape of the stacked body 15 located between dashed lines D1 in FIG. 16 is a step shape. Electrode layers 21A, 21B, and 21C which are three electrode layers from the top among the plurality of electrode layers 21 are divided in the Y-direction by the insulating member 71.

A plurality of supporting column portions 80 are provided in the stacked body 15 and extend in the Z-direction. The supporting column portion 80 is located in the cell region Rm and the dividing region Rd. In other words, as shown in FIG. 16, each of the cell region Rm and the dividing region Rd includes a region Rh in which the supporting column portion 80 is formed. For example, as shown in FIG. 17, the lower end of the supporting column portion 80 is located on the substrate 10.

Further, the cell region Rm includes a region Rcl in which the columnar portion CL is formed, and the lower end of the columnar portion CL is located above the substrate 10 with a connecting portion 10*b* interposed therebetween. The connecting portion 10*b* is, for example, an epitaxial layer formed by epitaxially growing the silicon of the substrate 10.

The insulating member 60 is located in a slit ST2 extending in the Y-direction and the Z-direction in the dividing region Rd. The insulating member 60 extending in the Y-direction intersects with at least some of the plurality of insulating members 70 extending in the X-direction. For example, as shown in FIG. 16, the insulating member 60 intersects with all of the plurality of insulating members 70. For example, when viewed in the Z-direction, the insulating member 60 and the insulating member 70 intersect in a letter T shape. When viewed in the Z-direction, the insulating member 60 and the insulating member 70 may intersect in a cross shape. Further, in the dividing region Rd, one insulating member 60 may be formed to intersect with the insulating member 70 in a cross shape. Further, the insulating member 60 extending in the Y-direction does not intersect with the insulating member 71 extending in the X-direction, but the insulating member 60 may intersect with all of the plurality of insulating members 71.

Incidentally, effects of the fourth embodiment are the same as those of the first embodiment.

Fifth Embodiment

Figure 18:
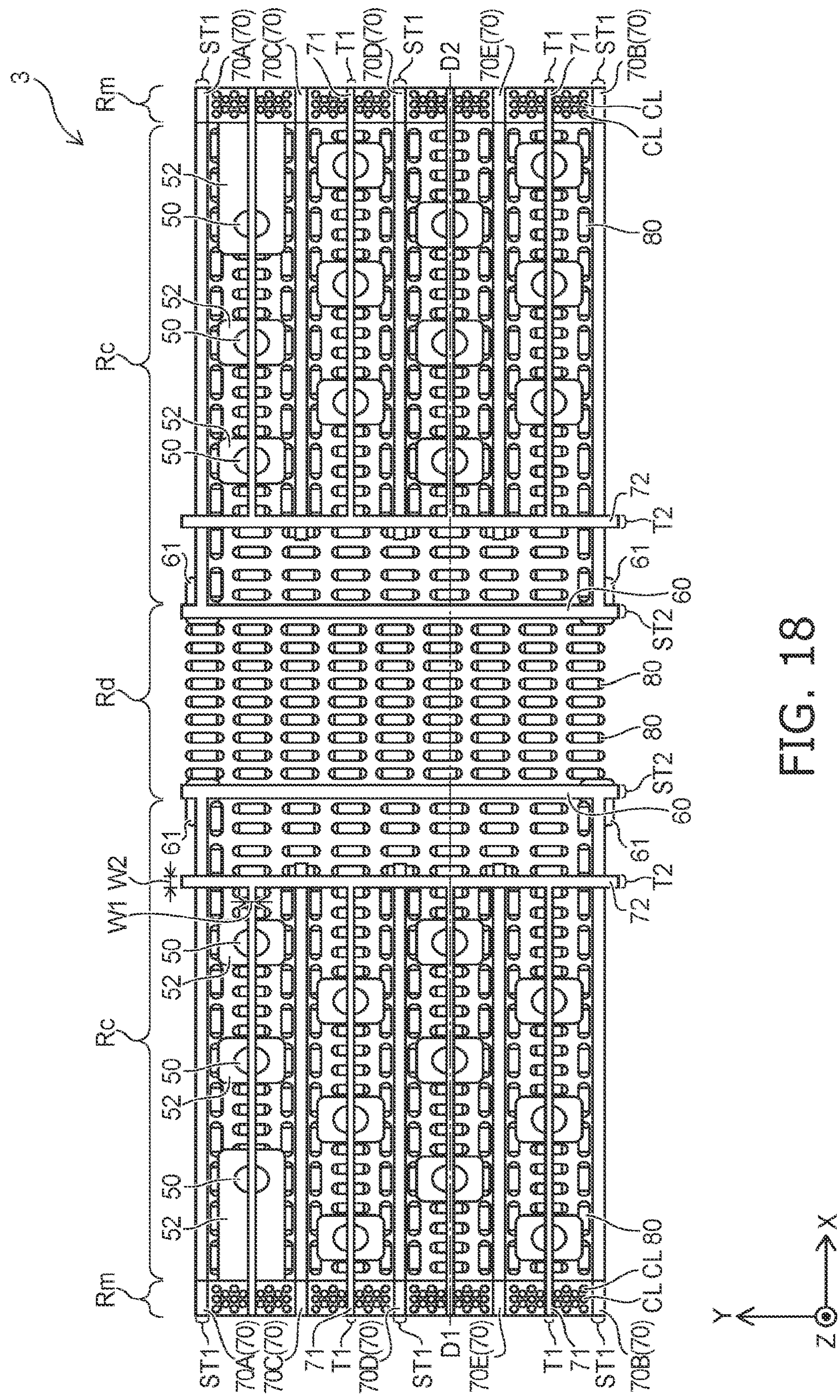
FIG. 18 is an enlarged plane view showing a part of a semiconductor memory device according to a fifth embodiment.

FIG. 18 is an enlarged plane view showing a part of a semiconductor memory device 3.

Figure 19:
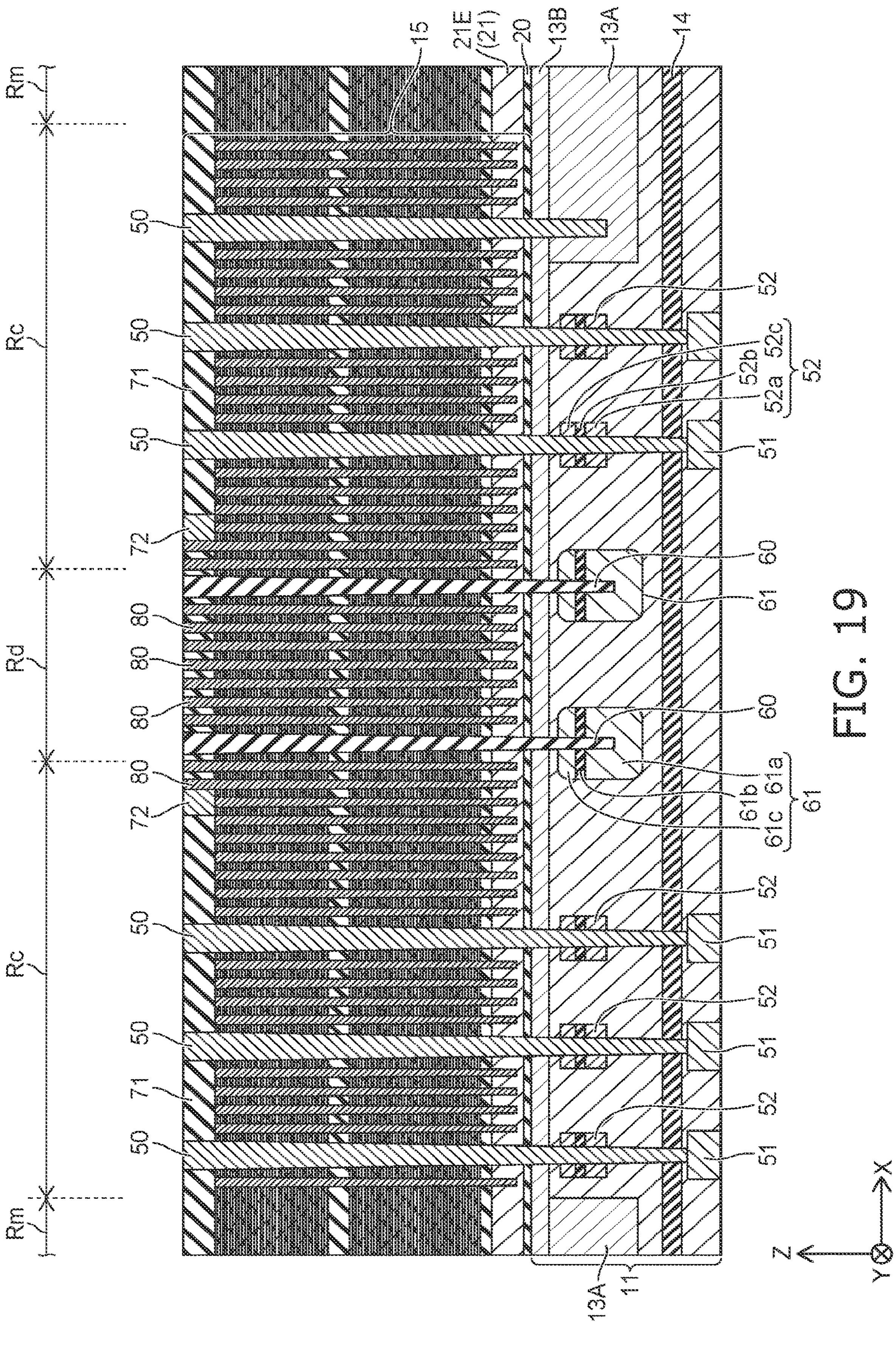
FIG. 19 is a cross-sectional view taken along line D1-D2 of FIG. 18.

FIG. 19 is a cross-sectional view taken along line D1-D2 of FIG. 18.

A region shown in FIG. 18 corresponds to the region shown in FIG. 4.

As shown in FIG. 18 and FIG. 19, an interlayer insulating layer 11, an interconnect layer 13A, a conductive layer 13B, an insulating layer 14, a stacked body 15, a columnar portion CL, a piercing via 50, a supporting member 52, an insulating member 60, a supporting member 61, an insulating member 70, an insulating member 71, an insulating member 72, and a supporting column portion 80 are provided in the semiconductor memory device 3.

The insulating member 72 is provided in the stacked body 15 and extends in the Y-direction. As shown in FIG. 18, the insulating member 72 is located in a groove T2 extending in the Y-direction in a first contact region Rc. The insulating member 72 includes, for example, the same material as the insulating member 71. The insulating member 72 includes, for example, a silicon oxide.

The insulating member 72 is a portion which is disposed in the upper portion of the stacked body 15 and divides one or more electrode layers 21 from the top into two together with the insulating member 71. In the examples of FIG. 18 and FIG. 19, three layers of the electrode layer 21 from the top are divided in the Y-direction by the insulating members 71 and 72. In other words, electrode layers 21A, 21B, and 21C (see FIG. 5) are divided in the Y-direction by the insulating members 71 and 72. Incidentally, the number of electrode layers 21 divided in the Y-direction is arbitrary.

When viewed in the Z-direction, the insulating member 72 intersects with the insulating members 70 and 71. As shown in FIG. 18, in a case in which the insulating member 72 intersects with all of a plurality of insulating members 70 and all of a plurality of insulating members 71, the shape of the stacked body 15 between the dashed line D1 and the dashed line D3 shown in FIG. 5 may not be processed into the step shape. In other words, since the insulating member 72 intersects with the insulating members 70 and 71, the electrode layers 21A, 21B, and 21C (see FIG. 5) are divided in the Y-direction in a portion in which the insulating member 71 between the insulating members 70 is located.

For example, the insulating member 72 intersects with the insulating member 70 in a cross shape when viewed in the Z-direction. The insulating member 72 may intersect with the insulating members 70 (insulating members 70C, 70D, and 70E) in a letter T shape excluding the insulating members 70 (insulating members 70A and 70B) which are located at both ends in the Y-direction and intersect with the insulating member 60 among the plurality of insulating members 70 when viewed in the Z-direction.

For example, the insulating member 72 intersects with the insulating member 71 in a T shape when viewed in the Z-direction. For example, the insulating member 72 is formed by forming a groove T2 extending in the Y-direction in the first contact region Rc by an etching process such as RIE and then filling the groove T2 with a silicon oxide. The groove T2 may be formed when a groove T1 extending in the X-direction is formed, and in this case, the insulating members 71 and 72 are formed by filling the grooves T1 and T2 with a silicon oxide.

For example, a width W2 of the insulating member 72 in the X-direction is larger than a width W1 of the insulating member 71 in the Y-direction. If the width W2 of the insulating member 72 is larger than the width W1 of the insulating member 71, it is possible to reduce the occurrence of defects such as seams and to improve embeddability of the groove T2 when the insulating member 72 is formed by filling the groove T2 with a silicon oxide or the like. Therefore, it is easy to form the insulating member 72 in the groove T2.

Here, if the insulating member 71 is formed so that the width W1 is increased, a forming area of the electrode layer 21 which is the current path in an operation of writing, reading, and erasing data decreases, and a resistance value increases. Accordingly, an electrical characteristic of the semiconductor memory device 3 decreases, and thus it is preferable to reduce the width W1 of the insulating member 71 as compared with the width W2 of the insulating member 72.

On the other hand, even though the width W2 of the insulating member 72 is larger than the width W1 of the insulating member 71, since influence on the forming area of the electrode layer 21 corresponding to the current path is small, the resistance value can be prevented from increasing. Accordingly, degradation in the electrical characteristic of the semiconductor memory device 3 is prevented.

Next, effects of the embodiment will be described.

Figure 20:
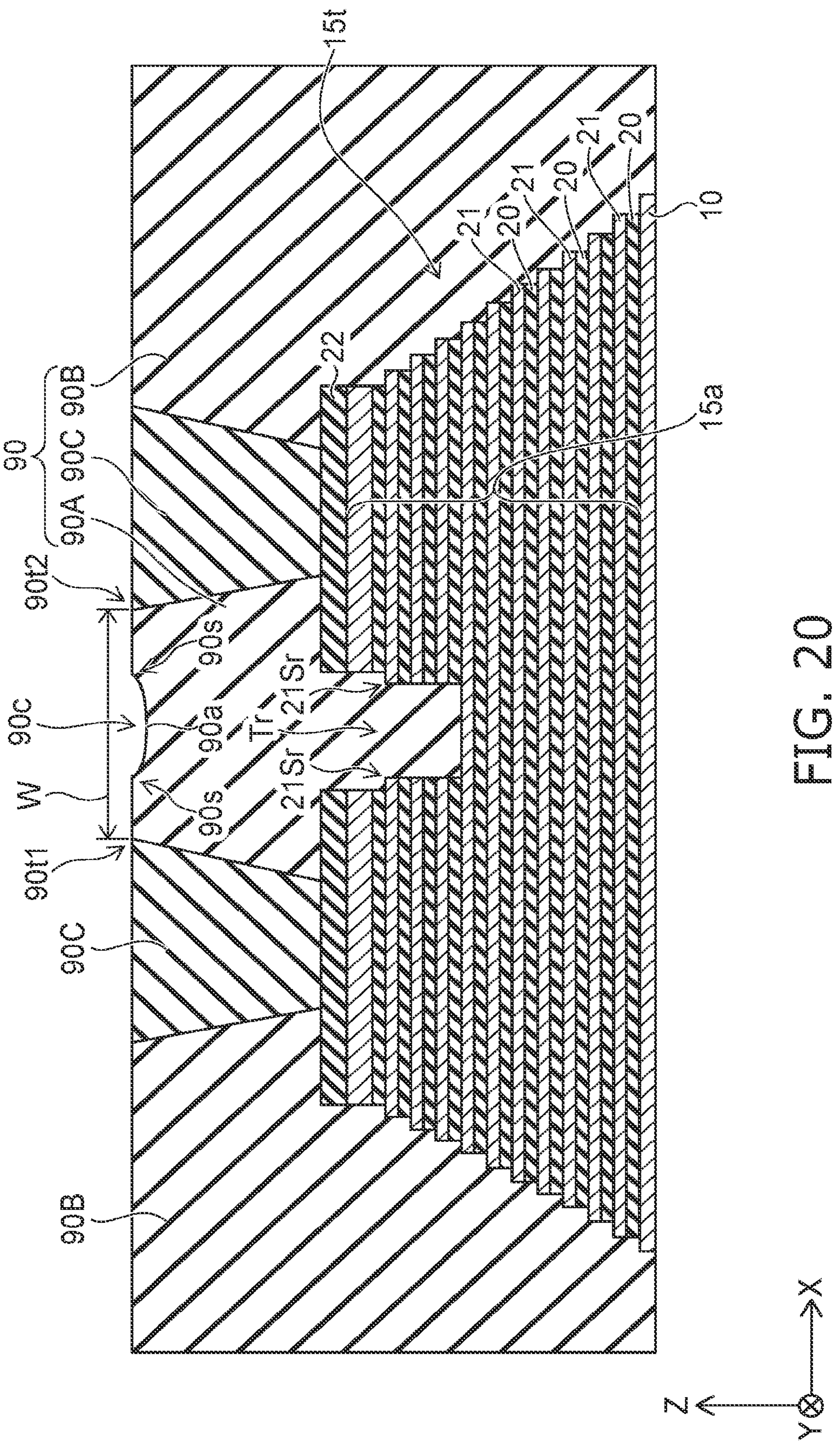
FIG. 20 is a cross-sectional view showing a semiconductor memory device according to a reference example.

FIG. 20 is a cross-sectional view showing a semiconductor memory device according to a reference example.

Incidentally, FIG. 20 shows a stacked body 15*a* provided on a substrate 10.

In a semiconductor memory device of a three-dimensional structure, in order to increase a degree of integration of a memory cell array by arranging a large number of columnar portions in an electrode layer, there are cases in which a structure in which the electrode layer is long in the X-direction is provided. In the semiconductor memory device having such a structure, writing, reading, and erasing of data are performed on each of memory cell arrays disposed on both ends of the dividing region in the X-direction as the electrode layer in the upper portion of the stacked body functioning as, for example, a drain side selecting gate is divided around the vicinity of the center of the stacked body.

For example, as shown in FIG. 20, in order to divide the electrode layer 21 in the upper portion of the stacked body 15*a* around the vicinity of the center of the stacked body 15*a*, the upper portion of the stacked body 15*a* is stepwise processed by photolithography and etching to form a groove Tr having a step 21Sr extending in the Y-direction. Then, an insulating layer 90A covering an insulating layer 22 on the stacked body 15*a* is formed to fill the groove Tr, and an insulating layer 90B covering an end portion 15*t* of the stacked body 15*a* is formed. Thereafter, an insulating layer 90C is formed in the cell region Rm to cover the insulating layer 22 on the stacked body 15*a*. The insulating layers 90A, 90B, and 90C constitute an interlayer insulating layer 90.

However, in the stacked body 15*a* having such a structure, when the insulating layer 90A is formed, the width W of the insulating layer 90A in the X-direction increases in order to fill the groove Tr. If the width W of the insulating layer 90A is large, when an upper surface 90*a* of the insulating layer 90A is planarized by, for example, a chemical mechanical polishing (CMP) technique after the insulating layer 90A is formed, it is likely to be difficult to perform the polishing process on the upper surface 90*a* of the insulating layer 90A. For example, after the polishing process of the insulating layer 90A, step 90*s* is likely to occur between end portions 90*t*1 and 90*t*2 and a central portion 90*c* in the upper surface 90*a*. In other words, if the width W of the insulating layer 90A is large, it is difficult to planarize the upper surface 90*a* of the insulating layer 90A.

Therefore, if the upper portion of the stacked body 15*a* is stepwise processed to form the groove Tr including the step 21Sr in order to divide the electrode layer 21 in the upper portion of the stacked body 15*a* around the vicinity of the center of the stacked body 15*a*, the width W of the insulating layer 90 formed to fill the groove Tr increases, and it is difficult to planarize the upper surface 90*a* in the planarization process. This is because, even in a case in which a groove of a step shape is formed around the vicinity of the center of the stacked body by repeating the etching process of slimming a resist, an insulating layer is formed to fill the groove of the step shape, and thus the upper surface of the insulating layer is planarized after forming the insulating layer. Therefore, even in a case in which a groove of a step shape is formed around the vicinity of the center of the stacked body by repeating the etching process of slimming a resist, the width of the insulating layer formed to fill the groove increases, and thus it is likely to be difficult to planarize the upper surface in the planarization process.

In the semiconductor memory device 3 of the embodiment, the insulating member 72 which extends in the Y-direction in the stacked body 15 and intersects with the insulating members 70 and 71 is provided. With such an insulating member 72, the groove Tr including the step 21Sr shown in FIG. 20 may not be formed around the vicinity of the center of the stacked body 15*a*. Further, with such an insulating member 72, the shape of the stacked body 15 between the dashed line D1 and the dashed line D3 shown in FIG. 5 may not be processed into a step shape. In other words, since the insulating member 72 is provided to intersect with the insulating members 70 and 71, the electrode layer 21 in the upper portion of the stacked body 15*a* can be divided. Accordingly, since the groove Tr may not be formed as in FIG. 20, or the shape of the stacked body 15 may not be processed into a step shape as in FIG. 5, an increase in the number of processes and an increase in cost in manufacturing the semiconductor memory device 3 are prevented.

Further, in the embodiment, as compared with the semiconductor memory device in which the groove Tr is formed as shown in FIG. 20 or the semiconductor memory device in which the shape of the stacked body 15 is processed into a step shape as shown in FIG. 5, the groove Tr or the step structure may not be formed, and thus the size of the semiconductor memory device 3 can be reduced. Further, in the case of the structure in which the first contact region Rc is not provided in the semiconductor memory device 3, the size of the semiconductor memory device 3 can be further reduced if the groove Tr or the step structure is not formed.

Incidentally, the other effects of the fifth embodiment are the same as those of the first embodiment.

Sixth Embodiment

Figure 21:
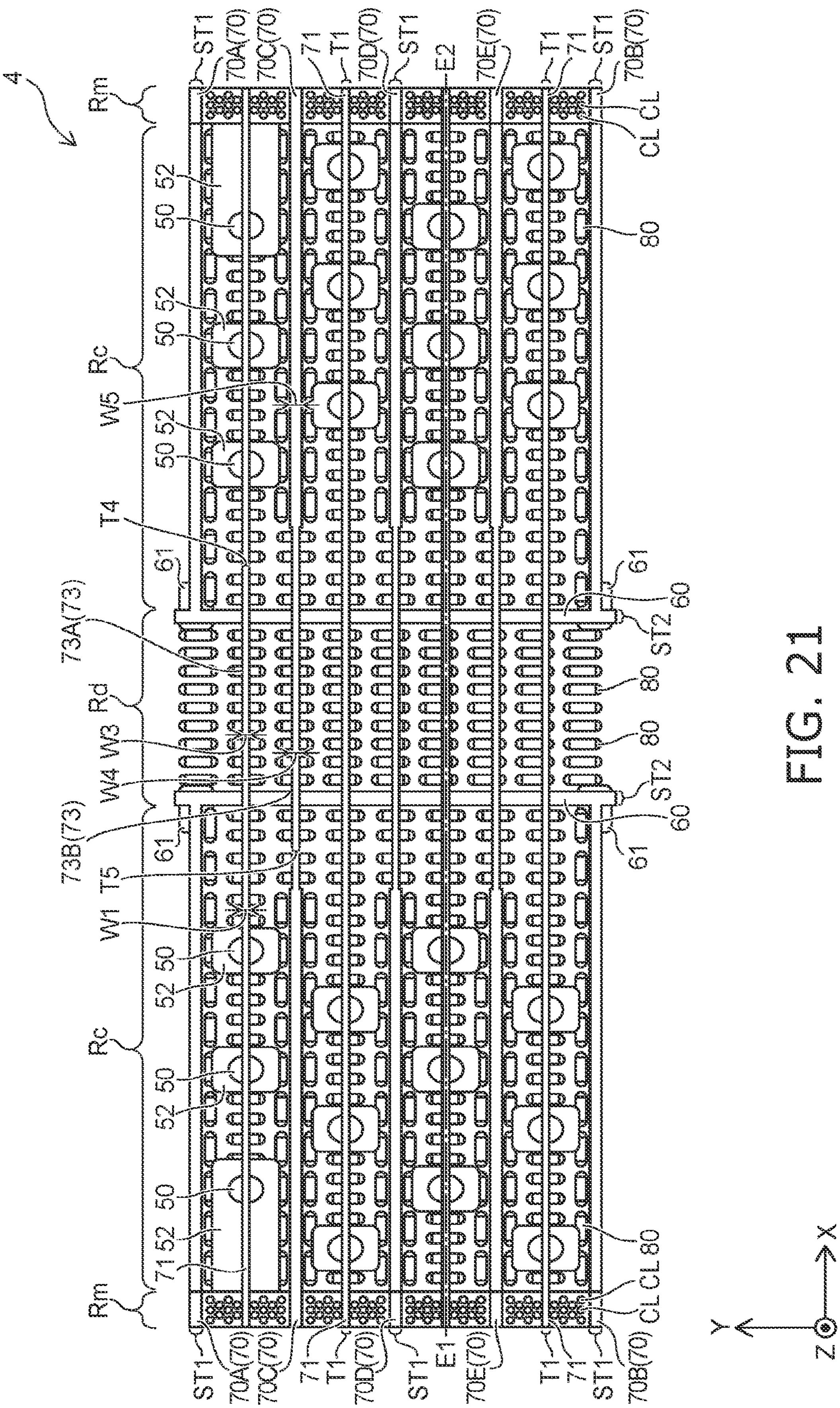
FIG. 21 is an enlarged plane view showing a part of a semiconductor memory device according to a sixth embodiment.

FIG. 21 is an enlarged plane view showing a part of a semiconductor memory device 4.

Figure 22:
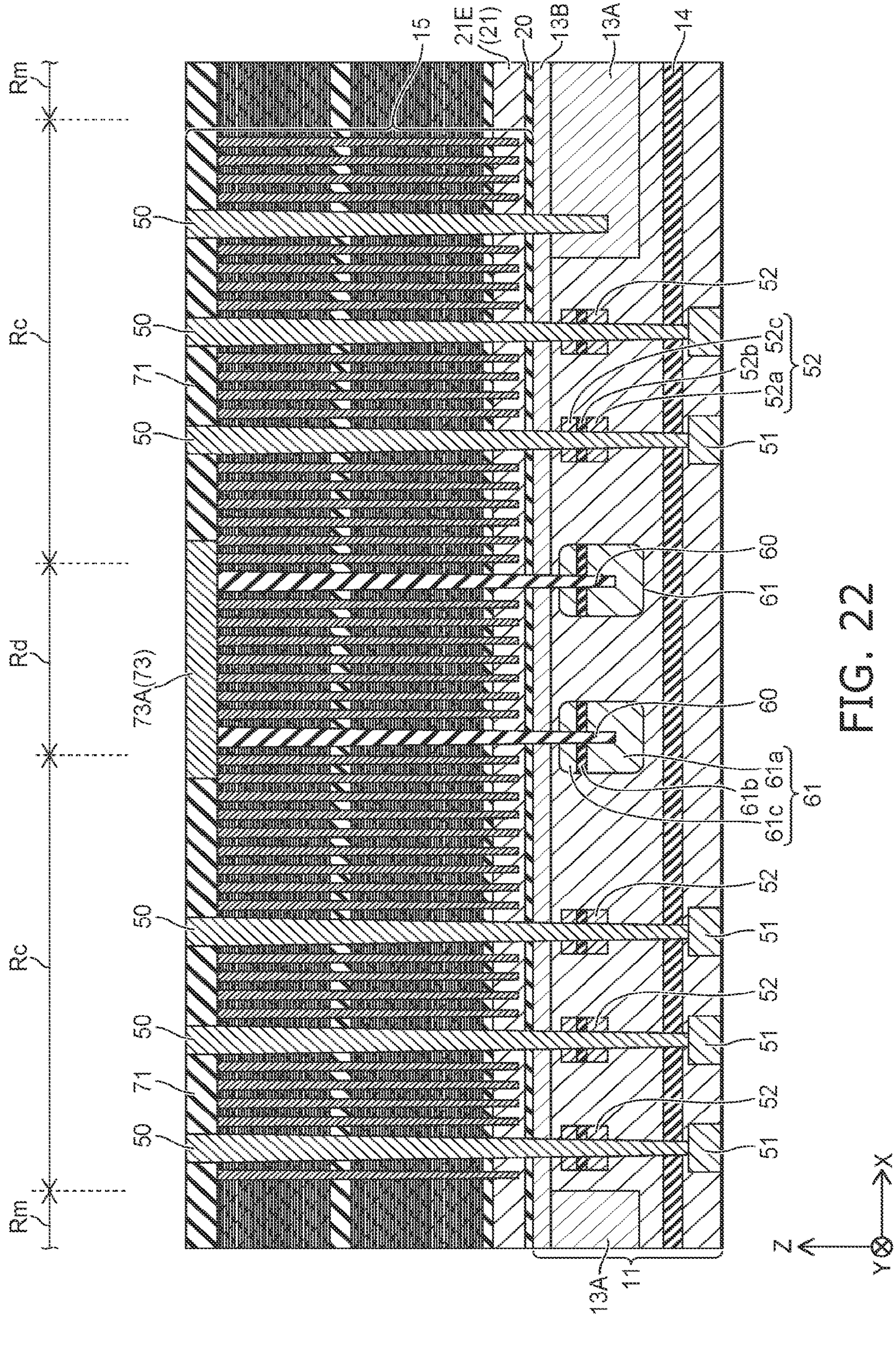
FIG. 22 is a cross-sectional view taken along line E1-E2 of FIG. 21.

FIG. 22 is a cross-sectional view taken along line E1-E2 of FIG. 21.

A region shown in FIG. 21 corresponds to the region shown in FIG. 4.

As shown in FIG. 21 and FIG. 22, an interlayer insulating layer 11, an interconnect layer 13A, a conductive layer 13B, an insulating layer 14, a stacked body 15, a columnar portion CL, a piercing via 50, a supporting member 52, an insulating member 60, a supporting member 61, an insulating member 70, an insulating member 71, an insulating member 73, and supporting column portions 80 are provided in the semiconductor memory device 4.

The insulating member 73 is provided in the stacked body 15 and extends in the X-direction. The insulating member 73 includes, for example, a silicon oxide.

The insulating member 73 includes an insulating member 73A and an insulating member 73B. In the example of FIG. 21, the insulating member 73A and the insulating member 73B are alternately disposed in the Y-direction.

The insulating member 73A is located between the insulating members 71 in the X-direction. For example, the insulating member 73A comes into contact with the insulating member 71 at both ends in the X-direction.

As shown in FIG. 21, the insulating member 73A is located in a groove T4 extending in the X-direction in the first contact region Rc and the dividing region Rd. The groove T4 is formed consecutively with the groove T1. For example, the width of the groove T4 in the Y-direction is substantially the same as the width of the groove T1 in the Y-direction. In this case, for example, a width W3 of the insulating member 73A is substantially the same as the width W1 of the insulating member 71.

The insulating member 73B is located between the insulating members 70 (insulating members 70C, 70D, and 70E) excluding the insulating members 70 (insulating members 70A and 70B) which are located on both ends in the Y-direction and intersect with the insulating member 60 among a plurality of insulating members 70. For example, the insulating member 73B comes into contact with the insulating members 70 (the insulating members 70C, 70D, and 70E) at both ends in the X-direction.

As shown in FIG. 21, the insulating member 73B is located in a groove T5 extending in the X-direction in the first contact region Rc and the dividing region Rd. The groove T5 is formed consecutively with the slit ST1. For example, the width of the groove T5 in the Y-direction is smaller than the width of the slit ST1 in the Y-direction. In this case, for example, a width W4 of the insulating member 73B is smaller than a width W5 of the insulating member 70. Further, for example, the width of the groove T5 in the Y-direction is substantially the same as the width of the groove T4 in the Y-direction, and the width W4 of the insulating member 73B is substantially the same as the width W3 of the insulating member 73A.

The insulating member 73 is a portion which is disposed in the upper portion of the stacked body 15 and divides one or more electrode layers 21 from the top into two together with the insulating member 71. In the examples of FIG. 21 and FIG. 22, three layers of the electrode layer 21 from the top are divided in the Y-direction by the insulating members 71 and 73. In other words, electrode layers 21A, 21B, and 21C (see FIG. 5) are divided in the Y-direction by the insulating members 71 and 73. Incidentally, the number of electrode layers 21 divided in the Y-direction is arbitrary.

When viewed in the Z-direction, the insulating member 73 intersects with the insulating member 60. As shown in FIG. 21, in a case in which the insulating member 73 intersects with the insulating member 60, the shape of the stacked body 15 between the dashed line D1 and the dashed line D3 shown in FIG. 5 may not be processed into a step shape. In other words, since the insulating member 73 intersects with the insulating member 60, the electrode layers 21A, 21B, 21C (see FIG. 5) are divided in the Y-direction in a portion in which the insulating member 71 between the insulating members 70 is located.

Incidentally, the effects of the sixth embodiment are the same as those of the fifth embodiment.

Seventh Embodiment

Figure 23:
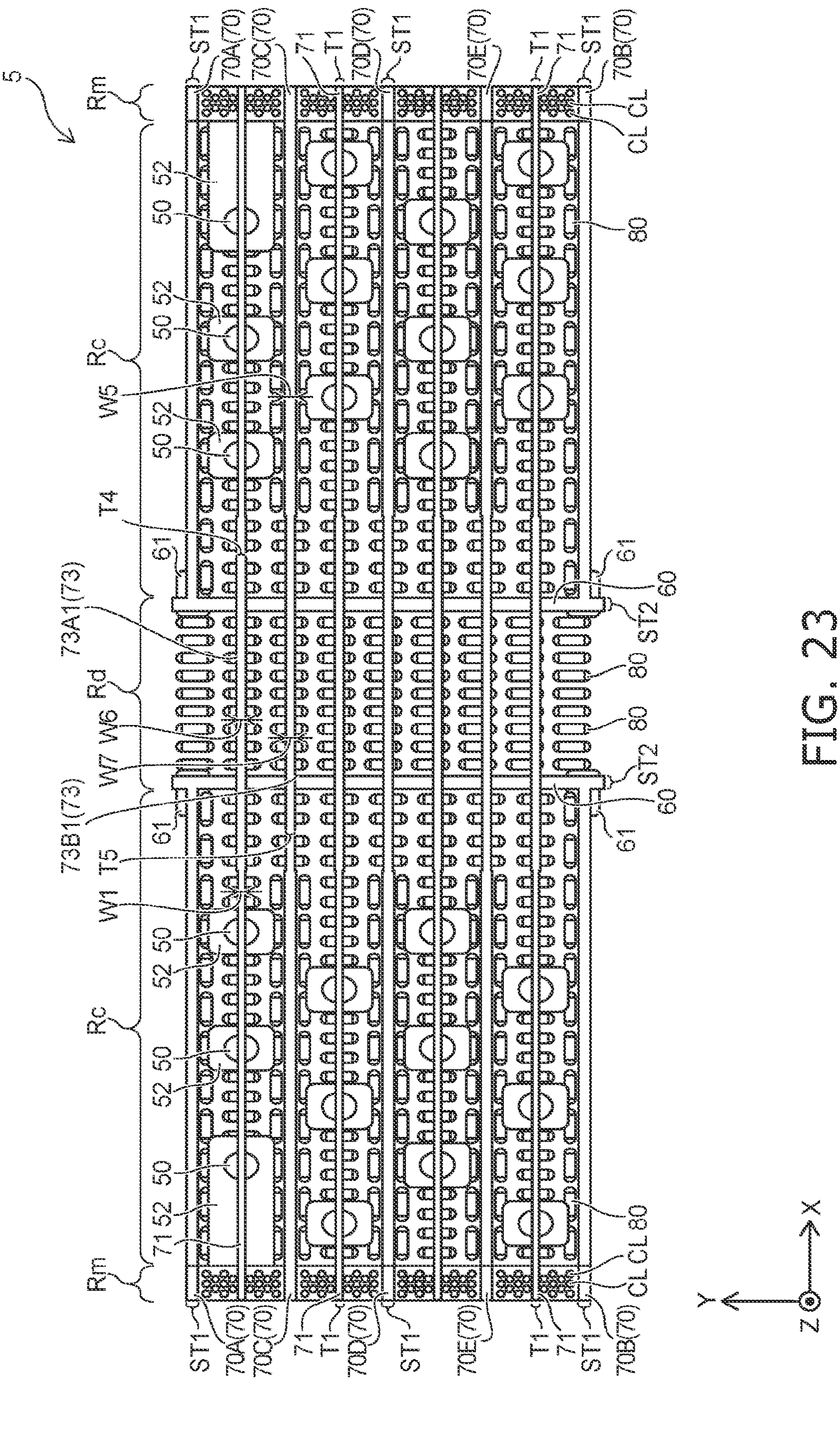
FIG. 23 is an enlarged plane view showing a part of a semiconductor memory device according to a seventh embodiment.

FIG. 23 is an enlarged plane view showing a part of a semiconductor memory device 5.

A region shown in FIG. 23 corresponds to the region shown in FIG. 4.

The semiconductor memory device 5 according to the embodiment is different from the semiconductor memory device 4 of the sixth embodiment in the size of the width of the insulating member 73. Since the remaining configuration is the same as the sixth embodiment, detailed description thereof will be omitted.

As shown in FIG. 23, the insulating member 73 has an insulating member 73A1 and an insulating member 73B1.

The insulating member 73A1 is located in a groove T4 extending in the X-direction in the first contact region Rc and the dividing region Rd. A width W6 of the insulating member 73A1 is larger than the width W1 of the insulating member 71.

The insulating member 73B1 is located in a groove T5 extending in the X-direction in the first contact region Rc and the dividing region Rd. A width W7 of the insulating member 73B1 is smaller than a width W5 of the insulating member 70 and substantially the same as the width W6 of the insulating member 73A1.

As compared with the insulating member 73A and the insulating member 73B of the sixth embodiment, the insulating member 73A1 and the insulating member 73B1 of the embodiment are larger in the width in the Y-direction. In other words, the width W6 of the insulating member 73A1 and the width W7 of the insulating member 73B1 shown in FIG. 23 are larger than the width W3 of the insulating member 73A and the width W4 of the insulating member 73B shown in FIG. 21.

If the width W6 of the insulating member 73A1 and the width W7 of the insulating member 73B1 are larger than the width W1 of the insulating member 71, in a case in which the insulating members 73A1 and 73B1 are formed in the grooves T4 and T5, respectively, the occurrence of defects such as seams is reduced, and the embeddability of the grooves T4 and T5 is improved. On the other hand, since the width W1 of the insulating member 71 located in the cell region Rm does not change, there is little influence on the forming area of the electrode layer 21 corresponding to the current path. This prevents an increase in resistance value and thus prevents degradation of the electrical characteristics of the semiconductor memory device 5.

Incidentally, the other effects of the seventh embodiment are the same as those of the fifth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions. Moreover, above-mentioned embodiments can be combined mutually and can be carried out.

What is claimed is:

1. A semiconductor memory device, comprising:
- a substrate;
- a first conductor layer including silicon and being provided above the substrate;
- a second conductor layer including silicon and being provided on and in contact with the first conductor layer;
- a first stacked body provided above the second conductor layer, including a plurality of first electrode layers stacked apart from each other in a first direction;
- a columnar portion penetrating the first stacked body in the first direction and including a semiconductor layer;
- a layered member provided between the substrate and the first stacked body, including a fourth conductor layer including silicon, the layered member provided in a plane providing the first conductor layer, the layered member provided separately from the first conductor layer in the plane, and a height of a lower surface of the fourth conductor layer being as same as a height of a lower surface of the first conductor layer in the first direction;
- a first insulating layer provided between the layered member and a lowermost electrode layer of the plurality of first electrode layers; and
- a first insulating member penetrating the first stacked body in the first direction and extending in a second direction crossing the first direction in the first stacked body and dividing the first stacked body in a third direction crossing the first direction and the second direction, wherein the semiconductor layer penetrates the second conductor layer and a lower end of the semiconductor layer is located in and in contact with the first conductor layer, the first insulating member penetrates the first insulating layer and has a lower end which locates in the layered member.

2. The device according to claim 1, further comprising:
- a second insulating member penetrating the first stacked body in the first direction and extending in the third direction in the first stacked body and dividing the first stacked body in the second direction; and
- a third insulating member provided next to the second insulating member in the second direction, penetrating the first stacked body in the first direction, extending in the third direction in the first stacked body, and dividing the first stacked body in the second direction, wherein an end portion of the second insulating member in the third direction and an end portion of the third insulating member in the third direction are respectively connected to different positions in the second direction of the first insulating member.

3. The device according to claim 2, wherein the first to third insulating members each include a silicon oxide.

4. The device according to claim 1, wherein the first stacked body includes a support column extending in the first direction through the plurality of first electrode layers.

5. The device according to claim 4, wherein the support column has a lower end positioned in the lowermost first electrode layer of the plurality of first electrode layers.

6. The device according to claim 1, wherein the first conductor layer is partially provided between the substrate and the second conductor layer, and the layered member is provided to be apart in the third direction from the second conductor layer.

7. The device according to claim 2, further comprising:

an interconnect layer provided between the substrate and the second conductor layer; and a piercing via provided between the second and third insulating members and connected to the interconnect layer, the piercing via extending in the first direction through the plurality of first electrode layers, and further extending in the first direction between the first conductor layer and the layered member.

8. The device according to claim 7, wherein the interconnect layer is provided at a height in the first direction lower than the height in the first direction of the lower surface of the first conductor layer.

9. The device according to claim 7, further comprising:

another layered member provided between the first conductor layer and the layered member, the piercing via extending in the first direction through said another layered member.

10. The device according to claim 7, further comprising:

another piercing via connected to the first conductor layer, said another piercing via extending in the first direction through the plurality of first electrode layers and the second conductor layer.

11. The semiconductor memory device of claim 1, wherein the first conductor layer includes polysilicon to which impurities were added.

12. The semiconductor memory device of claim 1, wherein the second conductor layer includes polysilicon to which impurities were added.

* * * * *